(12) United States Patent
Lawheed

(10) Patent No.: US 6,498,290 B1
(45) Date of Patent: Dec. 24, 2002

(54) CONVERSION OF SOLAR ENERGY

(75) Inventor: Paul Lawheed, San Diego, CA (US)

(73) Assignee: The Sun Trust, L.L.C., Spanish Fork, UT (US)

( * ) Notice: Subject to any disclaimer, the term of this patent is extended or adjusted under 35 U.S.C. 154(b) by 0 days.

(21) Appl. No.: 09/867,196

(22) Filed: May 29, 2001

(51) Int. Cl.⁷ ...................... H01L 31/052; H01L 31/058
(52) U.S. Cl. .................. 136/246; 136/259; 136/291; 126/600; 126/639; 126/678; 126/688; 126/694; 250/203.4
(58) Field of Search .................. 136/246, 259, 136/291; 126/600, 639, 678, 688, 694; 250/203.4

(56) References Cited

U.S. PATENT DOCUMENTS

| 4,000,734 A | * | 1/1977 | Matlock, et al. ............ 126/576 |
| 4,109,638 A | * | 8/1978 | Matlock et al. ............. 126/605 |
| 4,175,391 A | * | 11/1979 | Baer ........................... 60/531 |
| 4,202,322 A | * | 5/1980 | Delgado et al. ............ 126/574 |
| 4,238,246 A | | 12/1980 | Genequand |
| 4,245,153 A | | 1/1981 | Porter |
| 4,421,104 A | * | 12/1983 | Adcock ....................... 126/600 |
| 4,439,020 A | | 3/1984 | Maruko |
| 4,559,926 A | * | 12/1985 | Butler ......................... 126/578 |
| 4,649,899 A | | 3/1987 | Moore |

OTHER PUBLICATIONS

Concentrating Solar Power Research; National Renewable Energy Laboratory; Dec. 1998; FS24863.
Photovoltaic Research, National Renewable Energy Laboratory, Dec. 1998, FS24864.

* cited by examiner

Primary Examiner—Alan Diamond

(57) ABSTRACT

An array of elongated concave parabolic trough-shaped reflectors is disclosed. The orientation of the array is biaxially kept essentially perpendicular to rays of the sun by an optical control such that sunlight is reflected and concentrated along a focal line of each elongated reflector by which (a) water in a tube disposed at the focal line is heated by reflected line focused sunlight impinged thereon and/or (b) line focused reflected sunlight is optically transformed into point focused reflected sunlight using Fresnel lenses from which electricity is generated using solar cells upon which the point focused reflected sunlight is impinged.

32 Claims, 16 Drawing Sheets

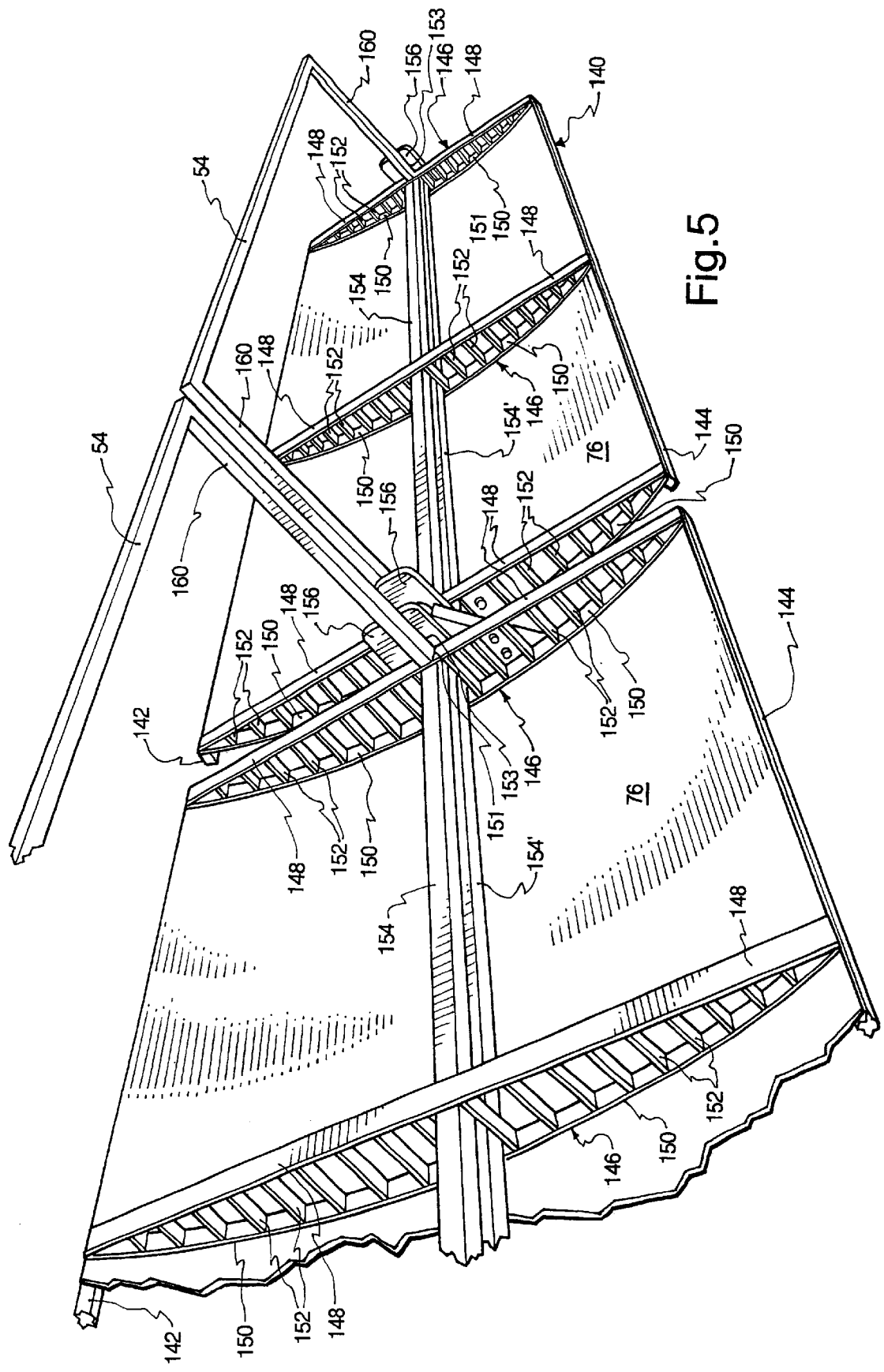

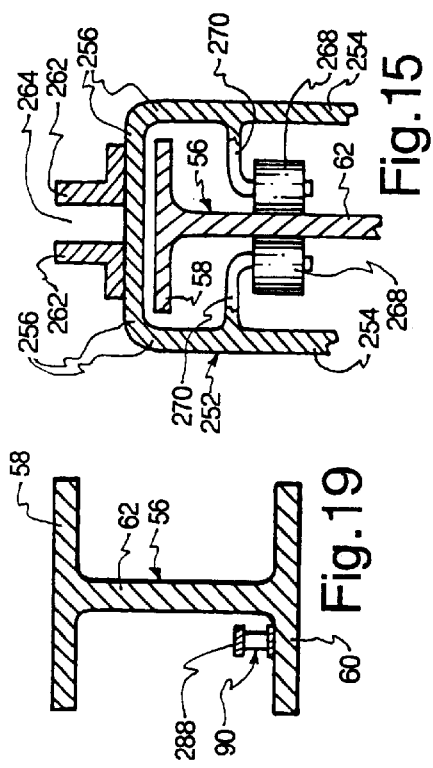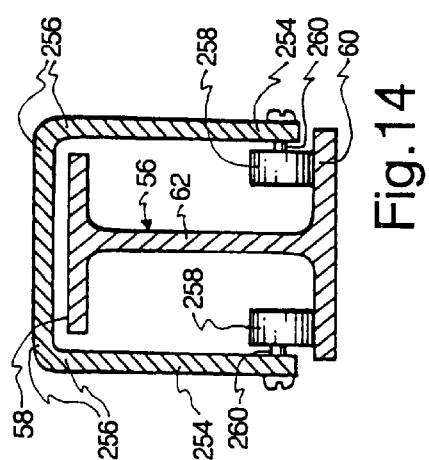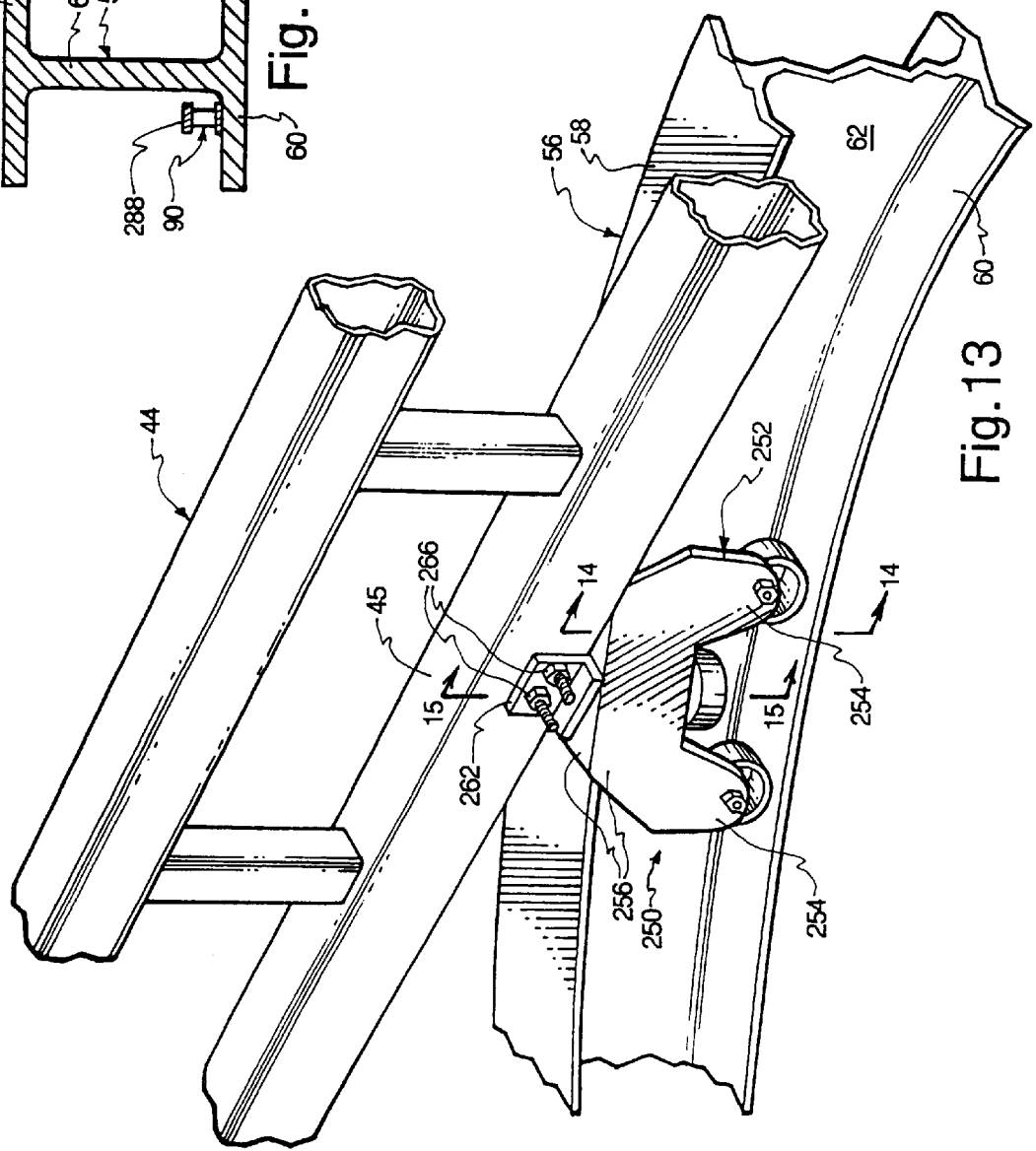

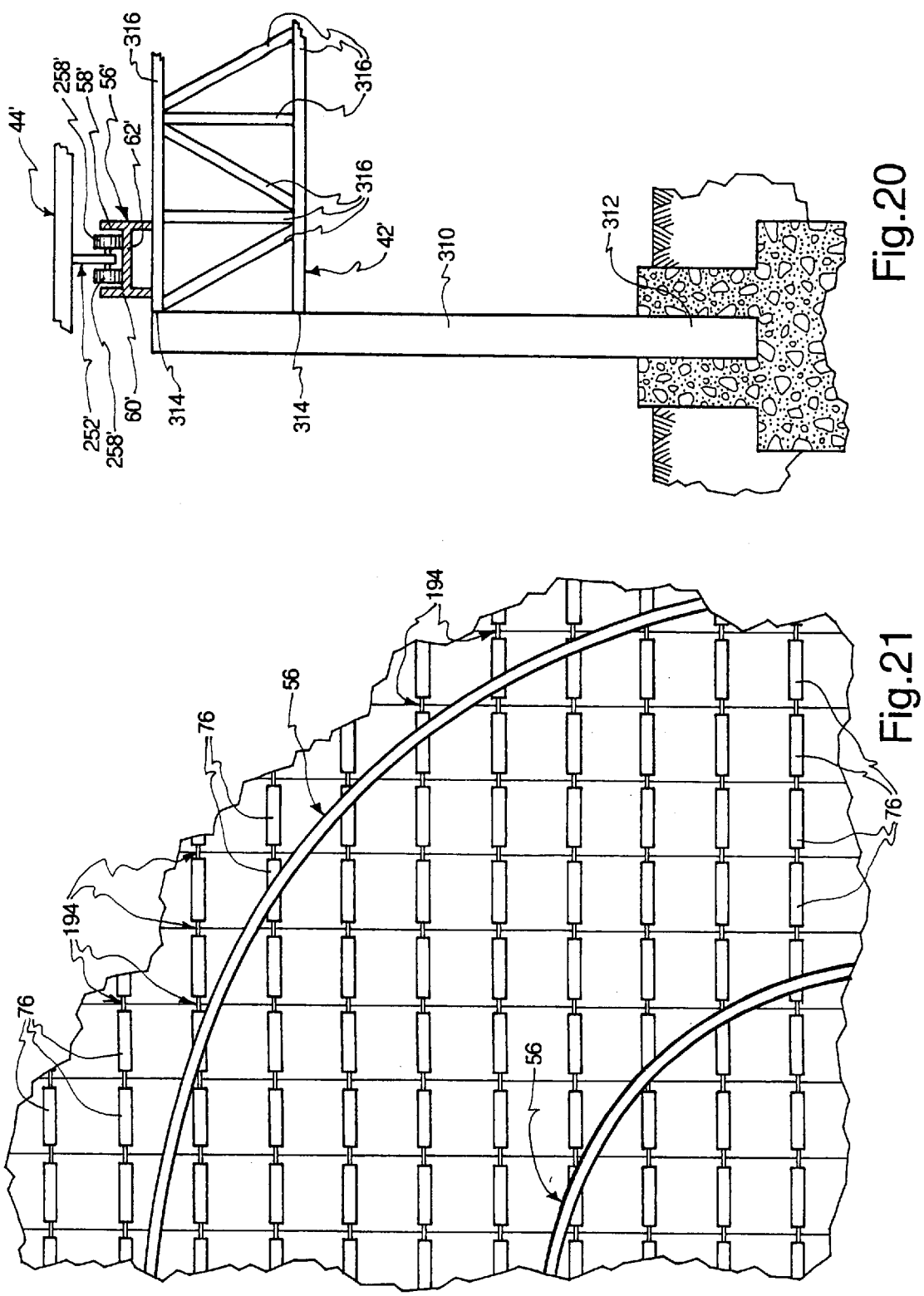

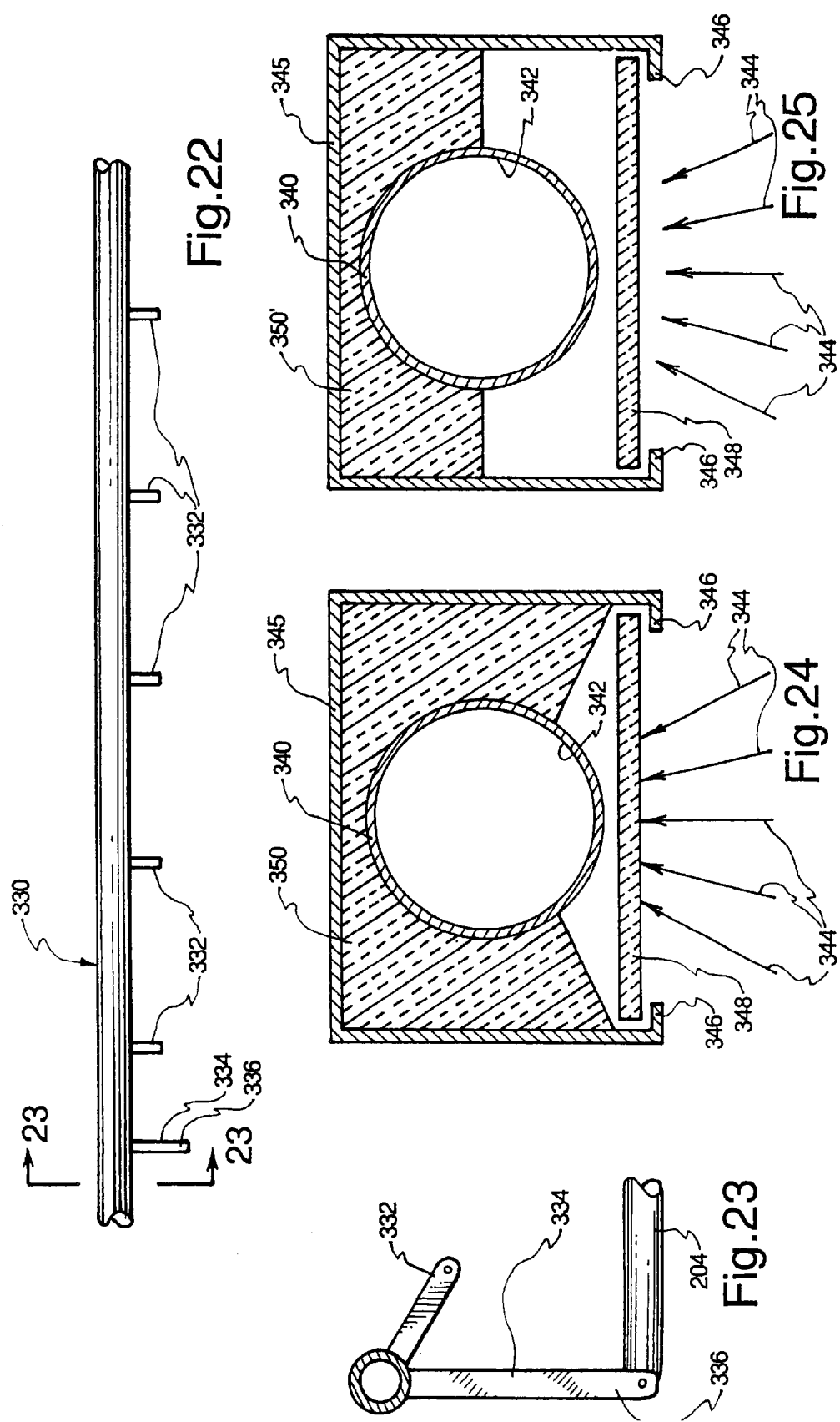

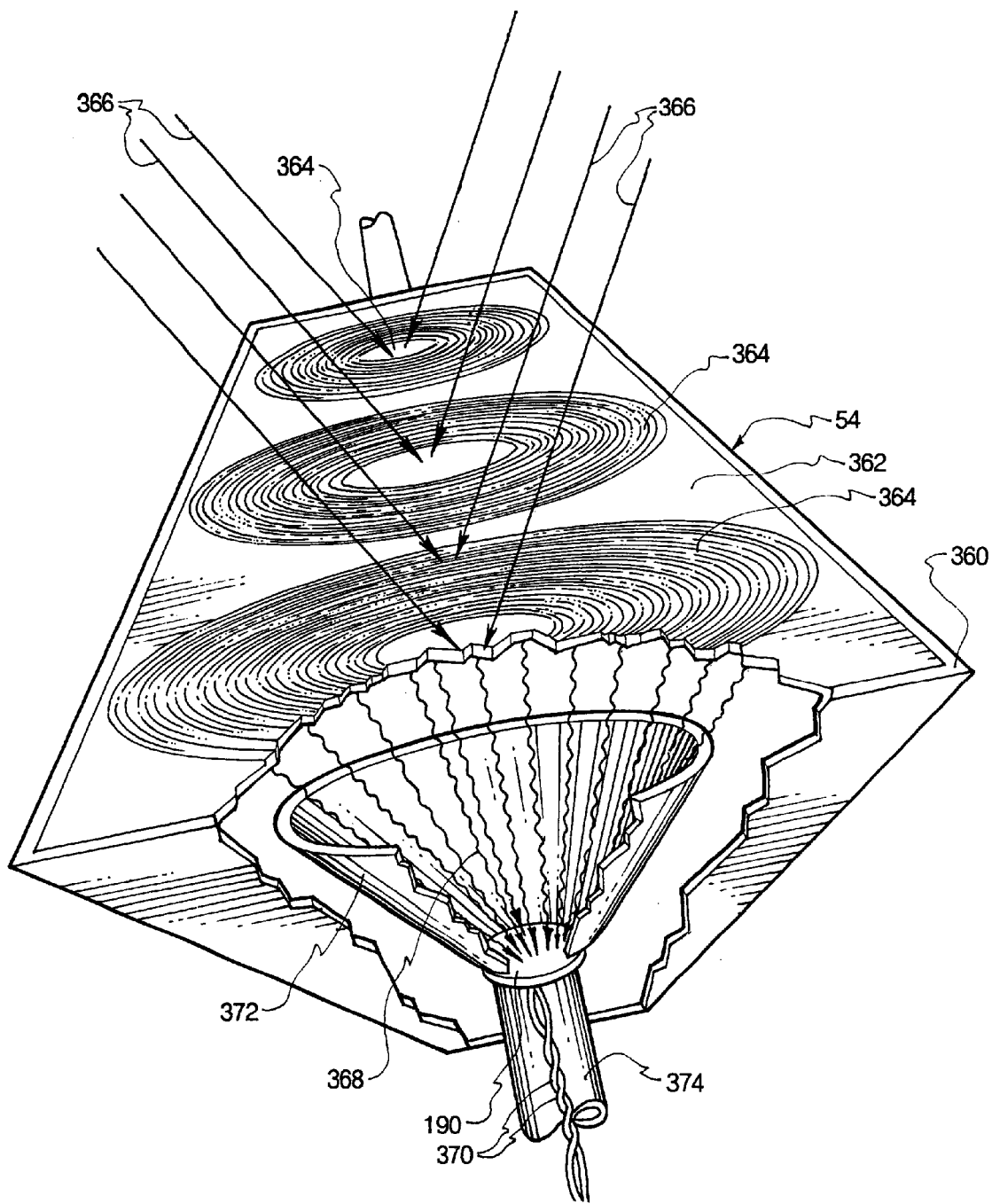
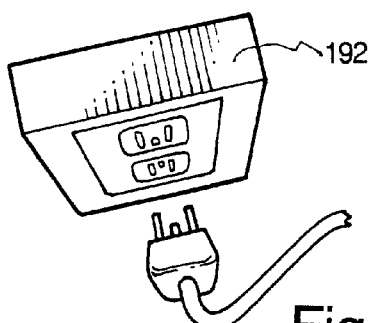
Fig.26

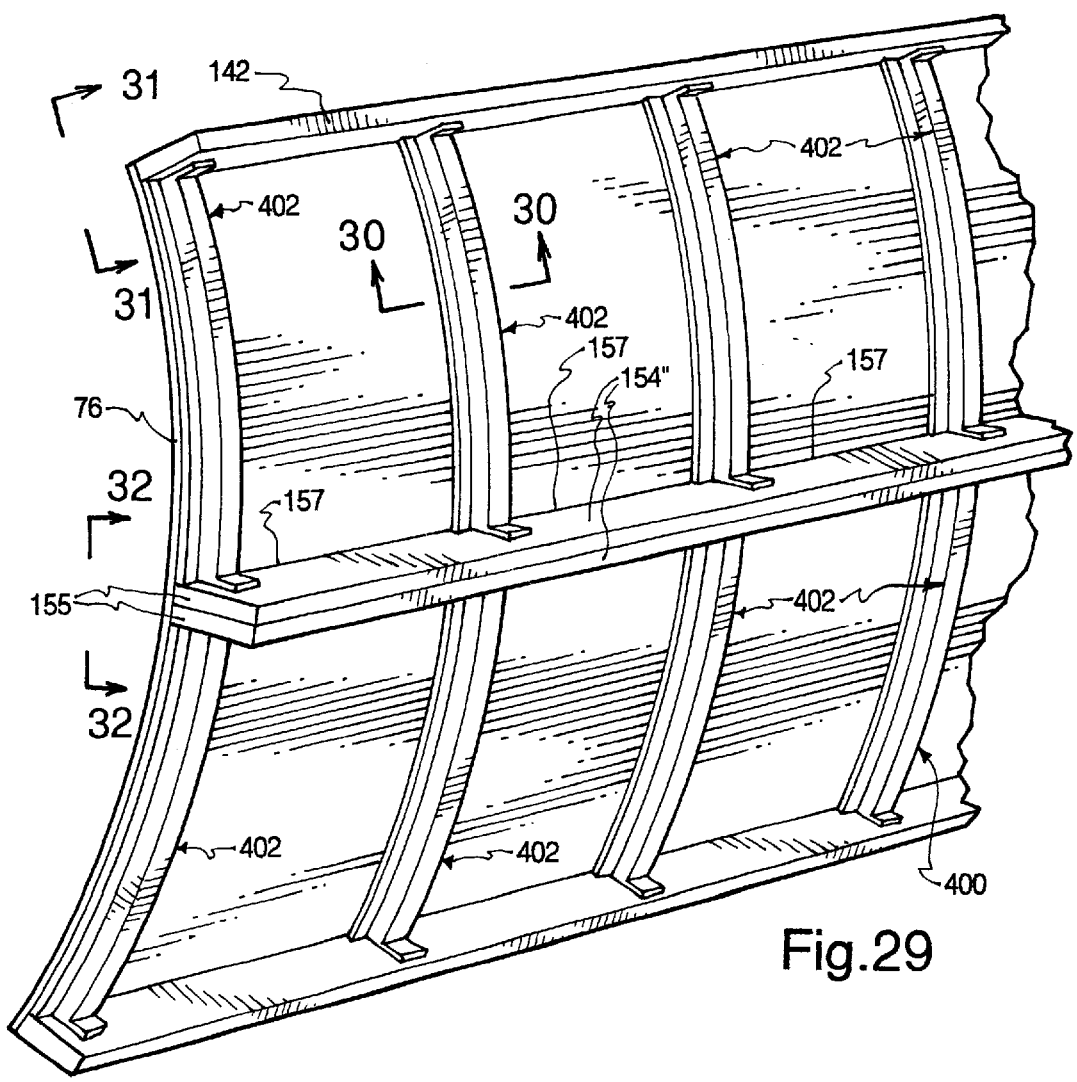
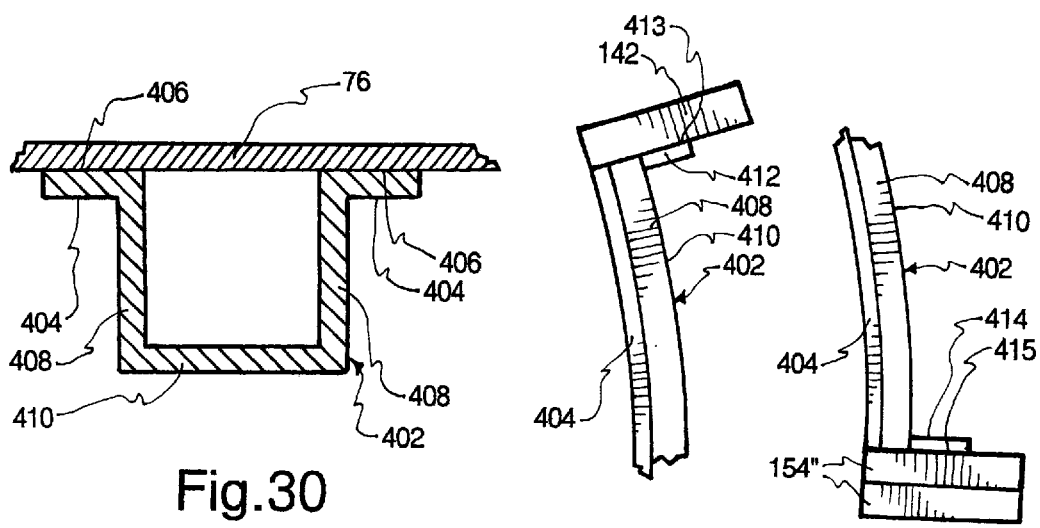
Fig.29
Fig.30  Fig.31  Fig.32

CONVERSION OF SOLAR ENERGY

FIELD OF THE INVENTION

The present invention relates generally to conversion of sunlight into other forms of energy, including thermal energy and electrical energy, and, more particularly, to use of elongated concave trough-shaped reflectors connected in an array for unitary movement, and maintaining essentially perpendicularity between the reflectors and the rays of the sun to heat water with linearly-focused, reflected sunlight and to create electricity with point-focused reflected sunlight derived from the line-focused reflected sunlight.

BACKGROUND

Solar energy is freely and daily available. It is a clean, non-polluting source of energy. Providing a reliable, long term, cost effective, efficient way of using sunlight to obtain electrical and thermal power has long been an unsolved problem, until the present invention.

It has been proposed that flat panel solar converters be used to convert direct sunlight into thermal or electrical energy.

Pedestal supported flat panels using direct sunlight to generate electricity were part of the Solar One project.

A circular, but concave reflector mounted on a single column or pedestal has been proposed. This approach was used on the Soler as water desalination project in Saudi Arabia and on the Solar Two project in Dagget, Calif.

Fixed position concave reflectors placed in an array and positioned in side by side rows on an incline have been proposed. See U.S. Pat. No. 4,202,322. Such an installation was made at the Federal Correctional Institution at Phoenix, Ariz.

Tiltable elongated concave reflector assemblies have been utilized, such as the one at Barstow, Calif., owned by FPL Energy SEGS VIII and IX.

Solar Systems comprising bidirectionally controlled Fresnel lens and solar cell assemblies, utilizing direct sunlight, have been proposed. See, U.S. Pat. No. 4,649,899, for example. Also see, U.S. Pat. No. 4,245,153. Optical detectors for dual axis tracking of the sun are known.

The above-identified proposals and installations have failed to provide reliable, low cost, efficient, variable capacity systems by which solar energy is converted to thermal and/or electrical energy. A long felt need has existed for energy conversion plants which are reliable, efficient, cost effective and size variable to meet both low and high capacity demands for thermal and electrical energy.

BRIEF SUMMARY AND OBJECTS OF THE PRESENT INVENTION

In brief summary, the present invention overcomes or substantially alleviates the long term problems of the prior art by which solar energy is converted to thermal energy and/or electrical energy. The present invention provides reliable, cost effective systems for such conversion, where the size of the system can be correlated to the desired capacity.

The orientation of an array of elongated concave parabolic trough-shaped reflectors is biaxially kept essentially perpendicular to rays of the sun by a control such that the sunlight is reflected and concentrated along a focal line of each elongated reflector by which (a) tube-contained water is heated at the focal line by reflected sunlight impinged thereon and/or (b) line focused reflected sunlight is optically transformed into point focused reflected sunlight from which electricity is generated using solar cells upon which the point focused reflected sunlight is impinged.

With the foregoing in mind, it is a primary object of the present invention to overcome or substantially alleviate the long term problems of the prior art by which solar energy is converted to thermal energy and/or electrical energy.

Another paramount object of the present invention is to provide reliable, cost effective systems for such conversion, where the size of any such system can be correlated to the desired capacity.

A further object of great significance is the provision of solar energy conversion systems wherein the orientation of an array of elongated concave parabolic trough-shaped reflectors is biaxially kept essentially perpendicular to rays of the sun by a control such that the sunlight is reflected and concentrated along a focal line of each elongated reflector by which (a) tube-contained water is heated at the focal line by reflected sunlight impinged thereon and/or (b) line focused reflected sunlight is optically transformed into point focused reflected sunlight from which electricity is generated using solar cells upon which the point focused reflected sunlight is impinged.

These and other objects and features of the present invention will be apparent from the detailed description taken with reference to the accompanying drawings.

BRIEF DESCRIPTION OF THE DRAWINGS

FIG. 5 is an enlarged fragmentary perspective of two parabolic trough-shaped reflectors and reflector frames together with energy converters disposed at the line focal point of each reflector, each converter being supported by two cantilevered structural members;

FIG. 13 is an enlarged perspective illustrating the manner in which the upper frame is displaced along a track of the lower to maintain said perpendicularity;

FIG. 14 is cross section taken along lines 14—14 of FIG. 13;

FIG. 15 is a cross section taken along lines 15—15 of FIG. 13;

FIG. 19 is a cross sectional view taken along line 19—19 of FIG. 2;

FIG. 20 is a fragmentary elevational view of an additional form of the present invention comprising a lower static frame supported upon columns and comprising a curved track upon which an upper frame is mounted for selective rotational displacement;

FIG. 21 is a fragmentary plan view of a relatively large embodiment of the present invention wherein the upper frame is rotatably mounted upon two or more tracks;

FIG. 22 is a plan view of a torque tube drive which may be used in lieu of a toggle mechanism when a large array of parabolic reflectors is utilized;

FIG. 23 is a cross section taken along lines 23—23 of FIG. 22;

FIGS. 24 and 25 are cross sectional views illustrating the manner in which a thermal converter disposed at the focal line of a parabolic reflector may be insulated;

FIG. 26 is a perspective representation of an energy converter adapted to be disposed at the focal line of a trough-shaped parabolic reflector to convert solar energy to electrical energy;

FIG. 29 is a fragmentary perspective of another reflector embodiment with the support frame on the convex or back side of the reflector; and FIGS. 30, 31 and 32 are a cross section taken along lines 30—30, 31—31 and 32—32, respectively, of FIG. 29.

DETAILED DESCRIPTION OF THE ILLUSTRATED EMBODIMENTS

Figure 1:
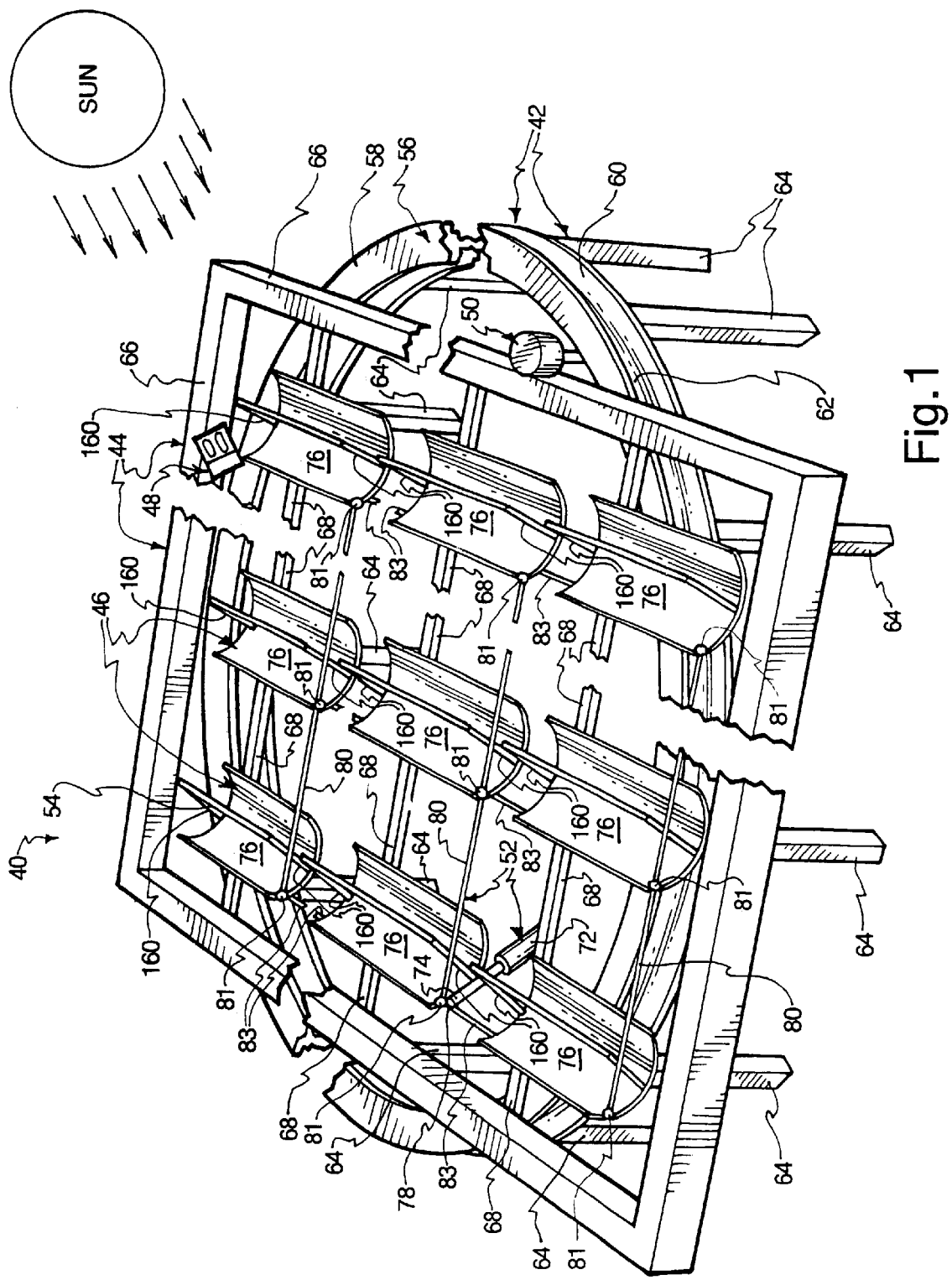
FIG. 1 is a perspective representation, schematic in nature of one configuration embodying principles of the present invention.

The present invention utilizes the free and limitless energy of the sun to produce electricity and thermal energy. The scale of embodiments according to the present invention can be tailored to the need, ranging from small stand alone systems for residential and small business use to intermediate sized plants for plant or factory use to massive assemblies design to mitigate against if not eliminate the electrical energy crisis in California. The present photovoltaic invention is economical to install and maintain, is reliable and not maintenance-intensive, is efficient and cost effective to operate and does not pollute the environment. The sun is not a consumable resource.

Using the present invention, businesses, industrial plants, retail and office buildings, homes, farms and villages can produce some, if not all, of their own electrical and thermal power, and avoid the largest uncontrollable cost of doing business today—the ever-escalating price of purchased power generated from fossil and nuclear fuels.

This invention is capable of making significantly more energy per square foot than conventional flat plate solar collectors. And flat plate collectors are incapable of co-generating the large amounts of thermal energy that the present concentrating photovoltaic generating systems make automatically.

Until now, remote installations have been faced with a difficult choice: pay the prohibitive costs of bringing in utility power, or depend on costly, noisy, and hard to maintain pollution-creating diesel, gas or propane generators. The present invention is a third and better choice, which can be scaled or sized to produce as much electrical and/or thermal energy as needed, independently, on site; the energy needed to power a home or business, pump water, irrigate land and run remote communication installations.

Unlike centralized forms of power generation, on-site de-centralized use of solar power needs no far-flung distribution network of gigantic towers and high voltage lines. Instead it utilizes a universally available asset—sunshine. No moving parts, except for the perpendicularity biaxial tracking system. It is noiseless, pollution-free, and requires almost no maintenance over many years of service.

Decentralized sunlight-derived electrical power can free users from the effects of peak-hour brown-outs, and from the possibility of total black-outs caused by operator error or the planned actions of groups hostile to utilities or nations.

The cost of the generating equipment itself—through the production of power for a building can be amortized over the life of the building, as part of debt financing (mortgage). Amazing as it may seem, one of the largest and most uncontrollable costs a building owner faces is the ever-escalating cost of power. Using the present invention, one actually has the ability to eliminate most of the cost of purchased power now and for years to come.

When land and water were plentiful and labor was cheap, little was known about the delicate balance existing between the environment and the extraction, burning, and wastes of non-renewable fuels. Now it is all too apparent that our supply of fossil fuels is limited—and that these sources are causing damage to our atmosphere, water supplies, and food chain—damage that is or may soon become irreversible. The costs, too, for fossil fuels continue upward as the more accessible fuel deposits are consumed, and as the costs for machinery, labor, and transportation continue to rise around the world.

Ironically, the best answer to the world's need for energy has always been the sun. The sun can satisfy a significant percentage of our energy requirements while helping us to become independent of the negative aspects inherent in conventional power generation. Switching to solar-derived power will reduce the pollution produced by coal, oil and nuclear fuels. It will also slow the use of oil and allow us to conserve it for more valuable uses, such as chemical feedstocks and plastics. The rate of coal usage would also be slowed. Harnessing the sun will also reduce, or eliminate, the need for nuclear power and mitigate its many risks and problems.

Even though the sun is just beginning to contribute to satisfying the world's energy demands on a large scale, direct sunlight has been powering satellites and spacecraft since 1958. In the 1970's the first terrestrially-directed sunlight photovoltaics supplied power to locations too remote to have ties to utility lines. Then, as the solar industry developed more efficient silicon cells and generators, larger grid-connected direct sunlight installations became practical.

The present invention is not space-intensive. One embodiment of the present invention can be mounted on an existing rooftop so that it essentially takes up no additional space at all. Ground-mounted systems on a pad or the like is also an option as well. Column mounting is a further option.

Various embodiments of the present invention may be used in conjunction with residences, office buildings, manufacturing facilities, apartment buildings, schools, hospitals, remote communications, telemetry facilities, offshore platforms, water pumping stations, desalination systems, disinfection systems, wilderness camping, headquarters installations, remote medical facilities, refrigeration systems, farms and dairies, remote villages, weather stations, and air conditioning systems, to name a few.

The present invention is also useful in: (a) providing cathodic protection against galvanite corrosion, (b) storage of electrical energy in batteries and (c) generation and sale of electricity to utility companies.

The sun is an energy source that, unlike fossil fuels, is free each day to whatever generation site is selected. It does not need to be mined, transported, refined, burned or purchased. So the costs for all these steps to produce energy are eliminated. Gone, too, are all forms of pollution. There are no particulates or gases vented into the atmosphere. Nor is there a need for millions of gallons of cooling water. (The small amount of water used to cool the solar cells actually becomes a second form of co-generated power, i.e. production of thermal energy, that has dozens of residential and commercial uses.) So water is conserved. There are no massive discharges of hot water into coastal waters to elevate the normal temperature and alter and perhaps destroy the habitats and food chains of coastal marine life. With solar energy, there are no wastes of any kind to be removed or buried in mines or deep at sea, so there are few, if any, health risks to our generation or future generations.

Various embodiments of the invention are modular, allowing any installation to be as large or as small to meet exactly the needs of the installation for electrical and/or thermal energy. The electricity produced is direct current (DC), which, when appropriate, may be transformed into alternating current (AC) using an inverter or DC-to-AC converter.

At the heart of the present invention is the utilization of a system which biaxially tracks the location of the sun in the sky to maintain a perpendicularity between an array of parabolic trough-shaped reflectors and the rays of the sun so that reflected line or point focused sunlight may be efficiently converted into thermal and/or electrical energy.

FIG. 1 is a diagrammatic representation of one configuration or system according to the present invention, which system is generally designated 40. System 40 comprises a lower stationary or static frame 42, an upper rotatable frame 44, mounted for movement upon the stationary frame 42, an array of parabolic trough-shaped reflectors, generally designated 46, carried by the upper frame 44, an optical sun-locating control, generally designated 48, carried by the upper frahie 44, a rotational drive mechanism, generally designated 50, by which the upper frame 44 is rotated about the lower frame 42 to maintain perpendicularity between the rays of the sun and the reflective surfaces of the parabolic reflectors comprising the array 46 under control of the optical sensor 48, a toggle reflector-tilting mechanism, generally designated 52, by which the angle of tilt of the parabolic reflectors of the array 46 is altered to maintain said perpendicularity as the sun travels across the sky and energy converters 54, one being disposed along the focal line of each parabolic reflector for converting reflected, concentrated sunlight into thermal and/or electrical energy.

An advantage of the present invention, when disposed in the form of apparatus 40, is that it is modular, i.e. the number of reflectors can vary, ranging from a relatively small number to a relatively large number, depending upon the needs of a given facility.

In the form shown in FIG. 1, the lower frame 42 comprises a curvilinear, preferably circular, track, generally designated 56, which, in cross section, is in the form of an I-beam comprising an upper flange 58, a lower flange 60 and a web 62. The track 56 is preferably made of steel and may be formed into the configuration shown in FIG. 1 using roller technology available at a conventional steel plant. The track 56 is supported upon a plurality of floor, roof or ground-engaging legs 64. Legs 64 may be of any desirable type. All or some of the legs 64 may be adjustable in length to provide for leveling, as herein described in greater detail, or of fixed length, where leveling is not a consideration in order to place the track 56 in essentially a horizontal orientation. The leg 64 may be made of steel construction, or some other suitable material may be used. Of course, the lower frame may be varied in its construction from that illustrated in FIG. 1 without departing from the spirit or essential characteristics of the present invention, so long as a tracking of the sun and adequate capacity are provided.

With continued reference to FIG. 1, the upper frame 44 is shown schematically as comprising a rectangular member 66, formed of hollow bar stock which is rectangular in cross section, for example, with interconnecting cross members 68 integrally joined at the ends thereof to the rectangular member 66, as by welding or use of conventional connectors comprising, for example, screw or nut and bolt fasteners. Upper frame 44, as illustrated in FIG. 1, is intended to be fundamentally diagrammatic, to illustrate principles associated with the present invention.

While not shown in detail in FIG. 1, the upper frame 44 is rotatably associated with the lower fixed frame 42 in such a way, for example, that rollers traverse the track 56 to and fro for the purpose of maintaining perpendicular azimuth alignment between the rays of the sun and the disposition of each reflectors 46 of the array. Rotational displacement of the upper frame 44 in respect to the lower frame 42, in this regard, is achieved by the motor and rotational drive assembly 50, responsive to signals from the optical detector 48, as explained herein in greater detail. The optical detector 48 is illustrated and is being mounted to a reflector frame associated with one of the reflectors 76, at site 70, in FIG. 1.

The toggle tilting mechanism comprises a motor-driven, reversible screw jack 72, the proximal cylinder end of which is connected to the upper frame 44 and the exposed distal piston end 74 thereof is pivotally connected at site 78 to one or more reflector frame members which support the assemblage or array of reflectors 76 for unitary variation in tilting to maintain altitude perpendicularity with the sun. As the piston rod 74 is extended and retracted, the reflectors 76 are tilted in unison by a toggle mechanism 80. The tilting mechanism 52 and toggle mechanism 80 are illustrated diagrammatically in FIG. 1. Each reflector 76 in a line or tandem of reflectors is non-rotatably connected to one or two adjacent reflectors by structural members 83 which accommodate the above-mentioned unitary tilting of the reflectors.

From the foregoing, it is clear that the upper frame 44 is, selectively rotated upon lower frame 42 pursuant to optical control signals and the trough-shaped parallel reflectors 76 are adjusted in the angularity of their tilt, so that each reflector 76 is essentially perpendicular to the rays of the sun at all times during daylight hours. It is the use of reflected line and point focused sunlight that significantly distinguishes the present invention.

Figure 2:
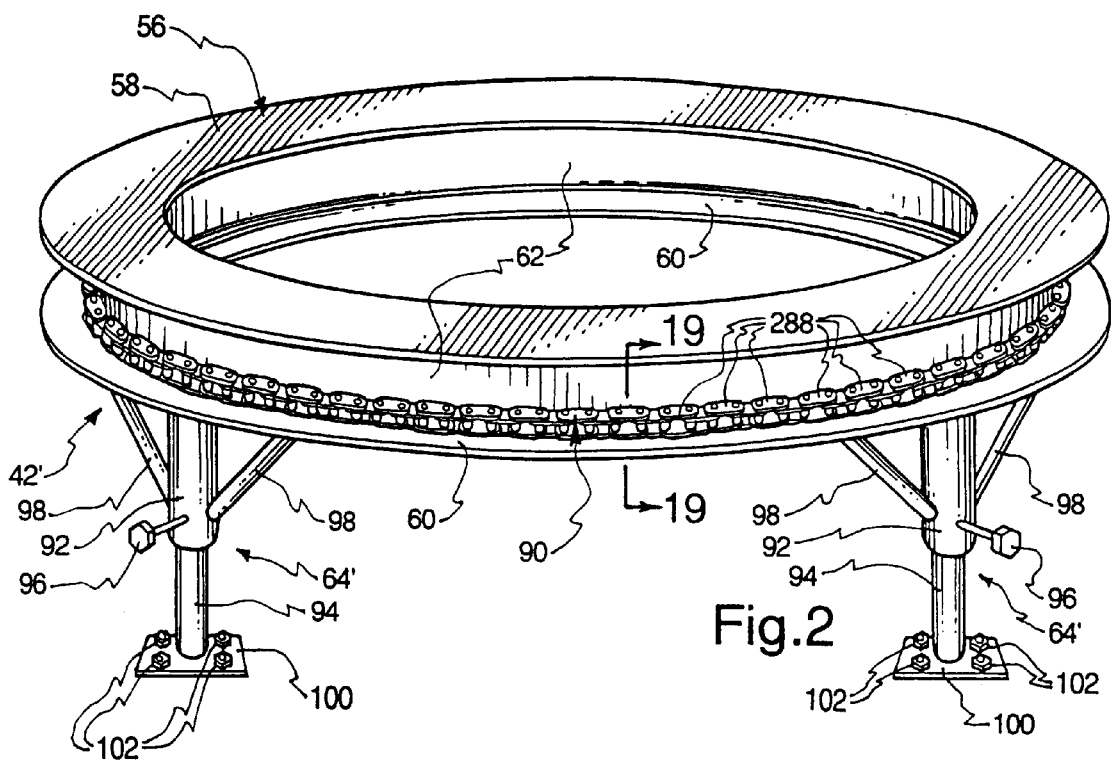
FIG. 2 is a perspective of one form of the stationary lower frame forming a part of embodiments of the present invention.

With reference to FIG. 2, a somewhat modified lower frame 42' is illustrated. This embodiment illustrates the previously described circular track 56. A drive chain 90 rests upon the lower flange 60 of the erect I-beam track 56 to accommodate selective rotation of the upper frame in respect to the lower frame 42' in the manner explained above. In lieu of leg 64, telescopic legs, generally designated 64', are provided. Each leg 64' is illustrated as comprising sequential aligned leg segments 92 and 94 which are telescopically interrelated so that the overall length may be adjusted to level the track 56. To do this, a set screw 96 is loosened, the correct collective length for the leg segments 92 and 94 established and the set screw 96 threadedly tightened through the leg segment 92 against the leg segment 94 to maintain the desired collective length. For added structural load-transferring stability, diagonal braces 98 are provided. The top of tube 92 and the top of each brace 94 is welded or otherwise suitably secured to the underside of lower track flange 60. The lower end of each diagonal brace 98 is welded or otherwise suitably secured to the associated tube 92.

The lower end of each tube 94 is illustrated as being welded to a plate or pedestal 100, which may be apertured so as to receive nut and bolt assemblies 102, with the lower heads thereof being imbedded in concrete for stability.

Figure 3:
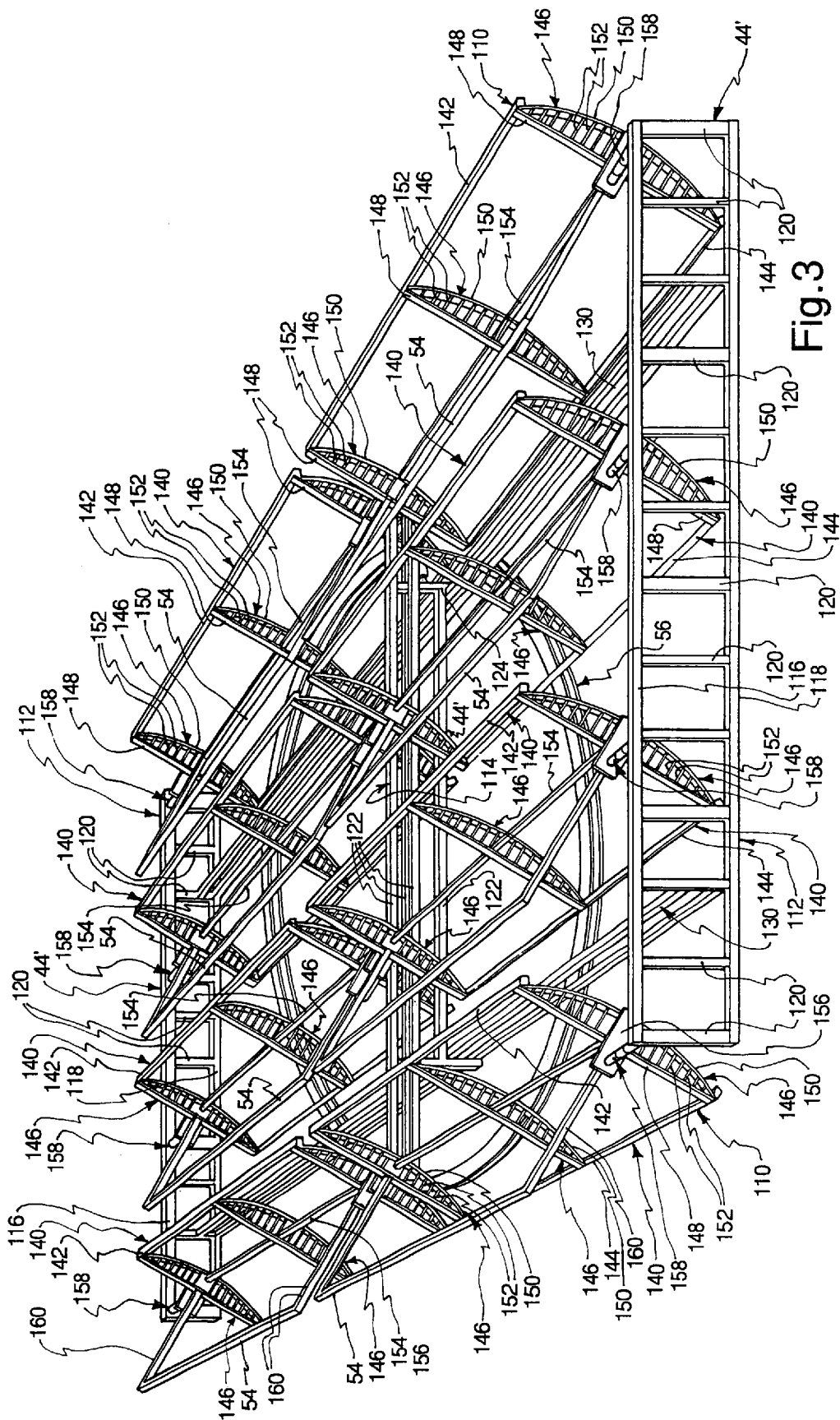
FIG. 3 is a perspective representation of an upper frame embodiment which is rotated optically to follow the sun, and reflector frames, the tilt of which is adjustable in unison.

With reference to FIG. 3, one type of suitable upper frame, generally designated 44', is shown, which implements principles of the present invention. The upper frame 44' is superimposed upon the circular track 56 and supports aligned pairs of reflector frames, each generally designated 110, by which the parabolic reflectors are rotated in unison to adjust their angle of tilt.

The upper frame 44' is relatively small in overall size, as is the track 56. The frame 44' can be expanded to accommodate essentially as many reflectors as necessary for any desired facility by which reflected, line and point focused sunlight is transformed into thermal and/or electrical energy.

The upper rotatable frame 44', illustrated in FIG. 3, is shown as comprising end beams, or trusses, preferably of steel, each generally designated 112, and an interior beam of steel, generally designated 114. Other types of suitable trusses or beams could be used.

Each end beam 112 is illustrated as comprising upper and lower horizontal bars 116 and 118, which are integrally connected as by welded to several vertical crossbars 120. The interior beam 114 comprises a plurality of horizontal members 122 and two vertical members 124, such that the horizontal members 122 and the vertical members 124 are welded together. A plurality of beams, generally designated 130, transversely connect to the end beams 112 and the intermediate beam or beams 114 so that the upper rotatable frame 44' is a rigid structure, providing ample support for the reflectors, the energy converters and the reflector frames.

As best illustrated in FIG. 3, each parabolic trough-shaped reflector 76 is supported by a reflector frame, generally designated 140. While only eight reflector frames 140 are illustrated in FIG. 3, as mentioned previously, the number of reflectors and, accordingly, the number of reflector frames can be expanded significantly beyond the small array illustrated in FIG. 3.

Each reflector frame 140 is essentially rigid and comprises top and bottom longitudinally-directed bars 142 and 144, connected by three trusses, each generally designated 146. Each truss 146 comprises a linear bar 148, a parabolic bar 150 and a plurality of cross bars 152, transversely spanning between bars 148 and 150, all ends of members 148, 150 and 152 being integrally connected as by welding.

Each reflector frame 140 also comprises at least one central longitudinally-directed support bar 154, welded to two end plates 156, by which the collective tilt of the reflectors is rotationally adjusted in respect to the rotatable upper frame 44', as hereinafter explained in greater detail. End axle journals 158 span between each outside end plate 156 and one of the end frames 112 and function as explained hereinafter in greater detail. Adjacent interior plates 156 are also connected one to another by a journal mechanism, explained hereinafter in greater detail, by which joint tilting rotation of adjacent reflectors and reflector frames is accommodated.

The previously mentioned energy converters 54, one of which is carried by each reflector frame 110 at the focal line of the associated parabolic reflector, is supported by two cantilever arms 160 one disposed at each end of the converter 54. Each arm 160 is connected by welding or the like to the central bar 154 and one end truss 146 to rigidly hold the associated converter 54 at the focal line of the associated reflector 76, the energy converter 54 bidirectional turning with the reflector as it is turned utilizing the power toggle mechanism 52.

Each reflector 76, none of which is shown in FIG. 3, is attached to each of the three associated parabolic members 150, spanning the full length and width of the associated reflector support frame 110. Rivets or other suitable fasteners may be used to connect the reflector to the associated parabolic members 150. Each reflector 76 is preferably comprised of polished sheet aluminum or other suitable highly reflective material.

The energy converter 54 for each reflector 76 is supported at the respective ends thereof by arm 160, which not only rigidly connects to one of the ends of the associated converter 54 but also at sites 151 and 153 (FIG. 5) to the associated reflector frame 140, as by welding.

Each converter 54 and the associated support arms 160 are typically hollow to accommodate liquid flow within a pipe to, through and from the converter 54 for the purpose of converting line focused or point focused reflected sunlight to thermal energy per se or in conjunction with the cooling of solar cells, which are exposed to very high temperatures during conversion of reflected point focused sunlight to electrical energy, as hereinafter explained in greater detail.

Figure 4:
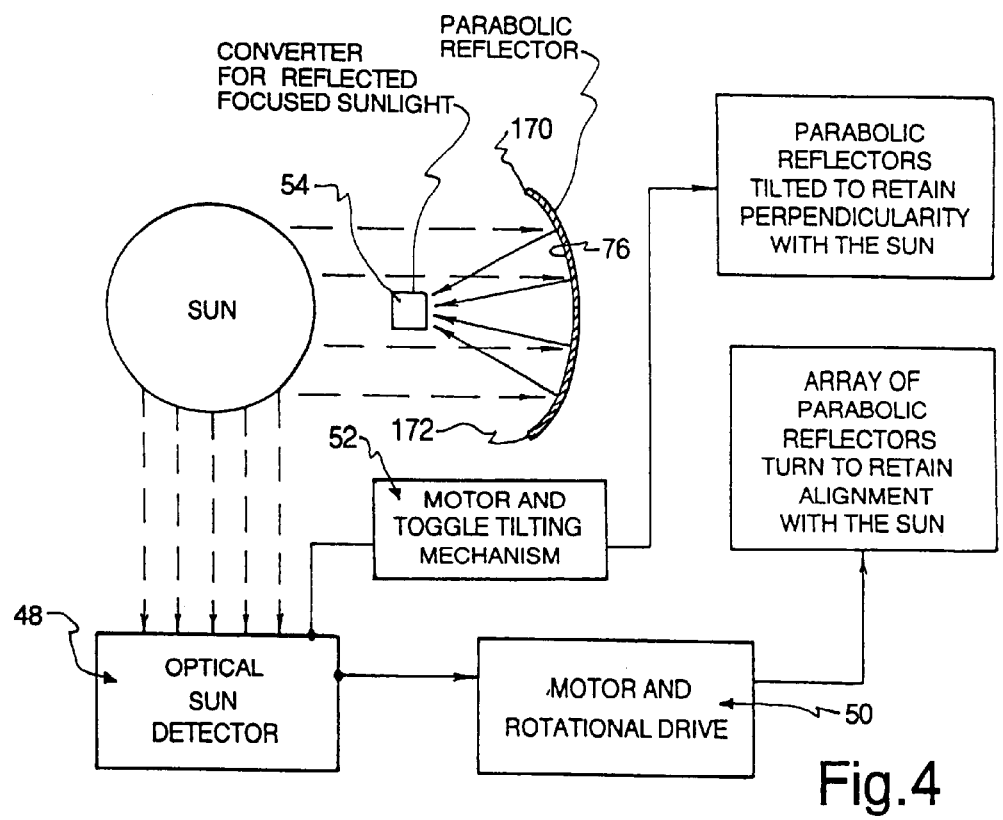
FIG. 4 is a diagrammatic representation of the manner in which the attitude and azimuth of the array of parabolic trough-shaped reflectors is displaced to maintain perpendicularity with the sun and the manner in which line-focused reflected sunlight is impinged upon a solar-to-thermal or solar-to-electricity converter.

From the foregoing, the significance of the illustration comprising FIG. 4 should be readily apparent, namely that the tracking optical sun detector 48 continuously senses the location of the sun in the sky relative to the azimuth and altitude of the array of reflectors 76 and, to the extent, the reflectors 76 are not collectively perpendicular to the sun, the differential is detected by the bidirectional optical sensor 48 and signals are issued to the motor and rotational drive 50 to place the axes of the reflectors into a position of perpendicularity with the sun. In addition, signals are issued by the detector 48 to the motor and toggle tilting mechanism 52 by which the tilt of the parabolic reflectors is placed in a perpendicular relationship with the rays of the sun, perpendicularity being intersection of the rays of the sun with a line drawn between the upper and lower edges 170 and 172 (FIG. 4) of each reflector.

Thus, both from altitude and an azumith point of view, the reflectors 76 are continuously adjusted so that reflector perpendicularity is maintained with the rays of sunshine striking each parabolic trough-shaped reflector. As a consequence, sunlight reflected from each reflector 76 is line-focused upon the associated energy converter 54, where the reflected, line-focused solar energy is either converted to thermal energy or point-focused and converted to electrical energy, as explained herein in greater detail.

The relationship between the reflector trusses 150 and the trough-shaped parabolic reflectors 76 is best illustrated in FIG. 5, in enlarged fragmentary perspective. In the configuration of FIG. 5, two central longitudinal reinforcing bars 154 and 154' are provided, in lieu of one, to enhance structural integrity.

Figure 6:
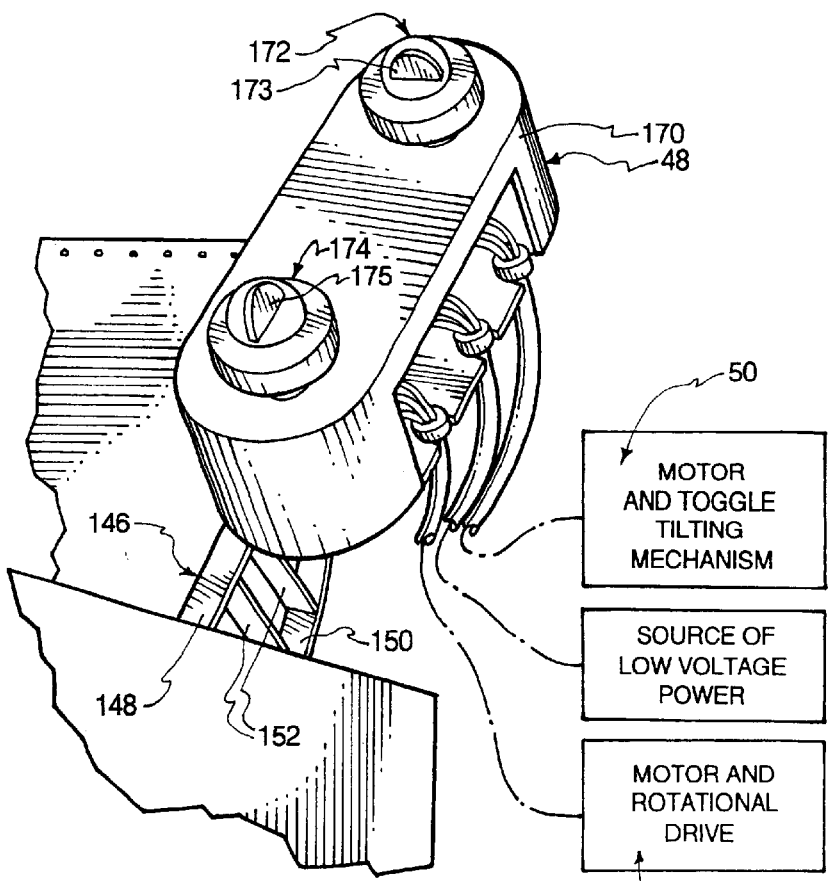
FIG. 6 is a fragmentary enlarged perspective of an optical detector used to cause the upper frame, reflector frames and reflectors to follow the sun in the sky so as to preserve perpendicularity between the reflectors and the rays of the sun.

In reference to FIG. 6, the optical detector 48 is illustrated in greater detail. Detector 48 comprises an external housing 170 which supports two shadow devices 172 and 174. Shadow bar device 172 comprises a shadow bar 173, by which lack of perpendicular alignment between the rays of the sun and the altitude or tilt angle of the reflectors is detected by one or more internal photocells. Shadow bar detector 174 comprises a shadow bar 175, by which lack of perpendicular azimuth or rotational alignment is detected by one or more internal photocells. When the internal photo cells detect a lack of either altitude or azimuth alignment via shadows caused by rays of the sun striking the shadow bars 173 and/or 175, signals are issued to the motor and rotational drive 50 and/or motor and toggle tilting mechanism 52 to bring the rotational position and the tilt position of the array of reflectors again into perpendicularity with the rays of the sun, after which the detector signals cease because no detectable shadow exists and rational and/or tilt adjustments stop.

Figure 7:
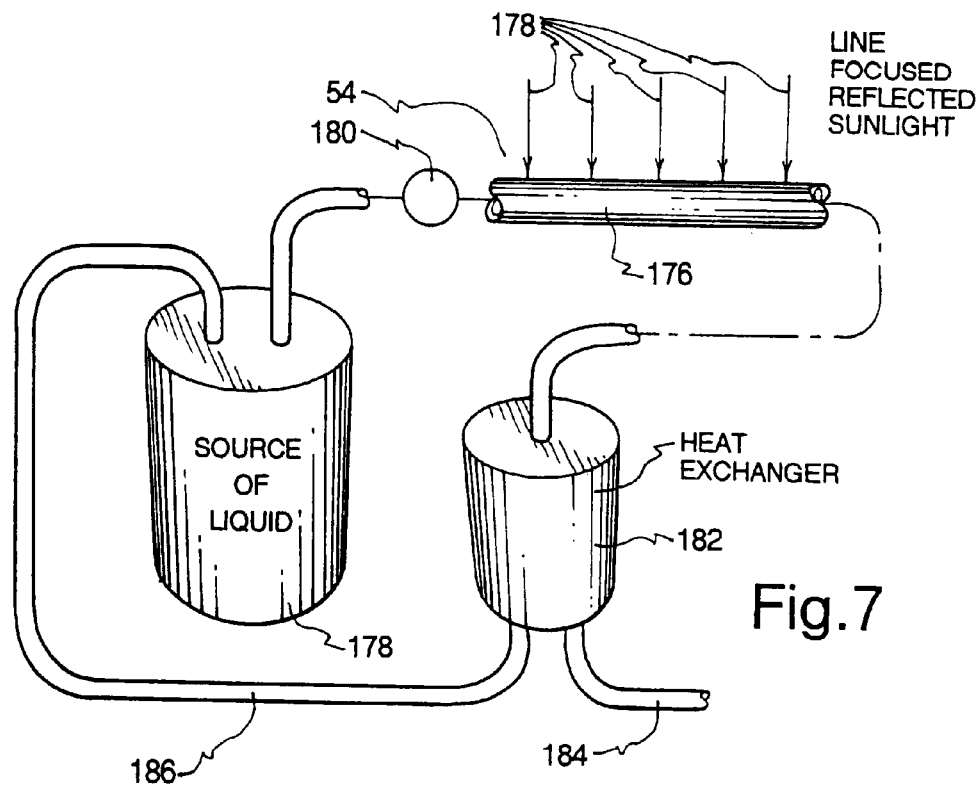
FIG. 7 is a schematic representation of a system by which line-focused reflected sunlight is converted to thermal energy.
Figure 8:
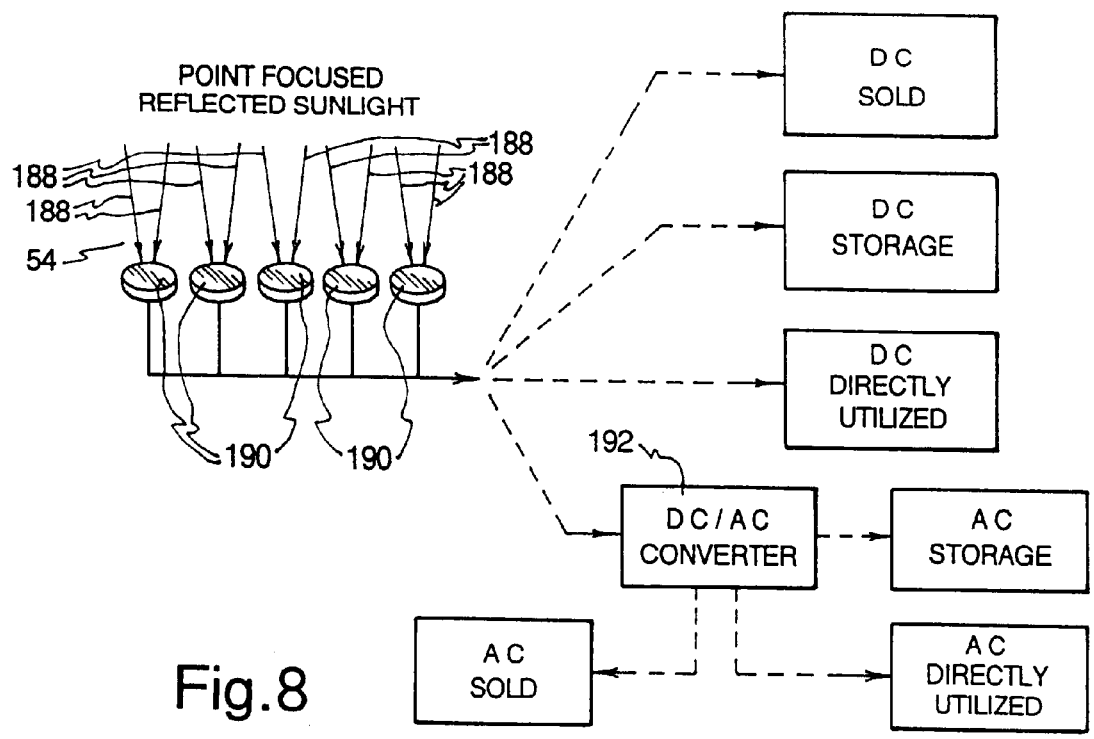
FIG. 8 is a diagrammatic representation of the manner in which point-focused reflected sunlight is converted to electrical energy.

Reference is made now to FIGS. 7 and 8 with particularity in respect to the types of energy converters which may be disposed at converter site 54. FIG. 7 illustrates a converter by which solar energy is transformed into thermal energy, while FIG. 8 illustrates an embodiment by which solar energy may be reflected and point focused for conversion into electrical energy. In respect to FIG. 7, a tube 176 is disposed at the focal line of reflector 76 so that the rays of line focused, reflected sunlight 178 impinge directly in concentrated form upon the thermally conductive material, such as copper, from which the tube 176 is formed.

As the rays of reflected, line focused sunshine heat the tube 176, liquid is displaced from source 178 through the tube 176 at a flow rate controlled by flow control 180. The liquid so displaced is heated by the elevated temperature of the tube 176, typically to a very high temperature along the focal line at 54, with the effluent hot water or steam being delivered, for example, to a heat exchanger 182, where the liquid or steam emerging from tube 176 is used to heat another segregated liquid, which is discharged from the heat exchanger as effluent from tube 184. The liquid entering the heat exchange 182 as influent is, after the heat exchanged process, discharged along tube 186, and is returned to the source 178.

The liquid contained within source 178 and circulated as indicated above may be, in selected instances, water and, in other instances, a mixture of alcohol and water, as chosen by one skilled in the art. Other suitable liquids may be used.

With specific reference to FIG. 8, the line focused reflected solar energy 188 is caused to be point focused, for example by a series of Fresnel lenses, as shown diagrammatically at 188 in FIG. 8. The point focused rays 188 of sunlight are impinged upon a series of solar cells 190, the characteristic of which transforms the point of focus reflected sunlight 188 into direct current electrical energy, which may be sold, stored or directly utilized. In the alternative, the DC electricity can be passed through a DC/AC converter 192 to create alternating current electricity, which may be stored, sold or directly utilized.

While not shown in FIG. 8, it is to be appreciated that the solar cells 190 typically are mounted or otherwise made contiguous to the external surface of a cooling tube to hold the temperature of the solar cells 190 within a lower acceptable temperature range. As a consequence, liquid contained within the cooling tube is heated, which heated liquid may be utilized in any suitable fashion including but not limited to the one described above in respect to FIG. 7.

As mentioned earlier, in conjunction with FIG. 3, the reflector frames 140 are collectively assembled so as to rotate in unison around journals, such as end axle/journals assemblies 158, the journals/assemblies axles, of any string or tandem of aligned reflector frames 140 being disposed along a common axis. Each journal/axle assembly 158 essentially comprise a central short axle such that diametrically reduced ends of the axle fit within opposed sleeves at opposite ends of the axle. Each axle is stabially secured to the upper frame 44, 44; while the sleeves rotate around the associated axle with the reflector frames.

Similarly, journals/axle assemblies 194 (FIG. 9) are interposed between sequential aligned reflectors 76 and comprise outer sleeves 196 at each end of the journal and a central short axle comprising reduced diameter ends 198 rotatably disposed within the sleeves 196. The axles comprising ends 198 are rigidly connected to the upper frame 44, 44; while the sleeves 196 are connected to and rotate with the reflector frames 140. As can be seen from inspection of FIG. 9, the aligned axles of any aligned group of reflector 76 creates an axis of rotation.

Figure 9:
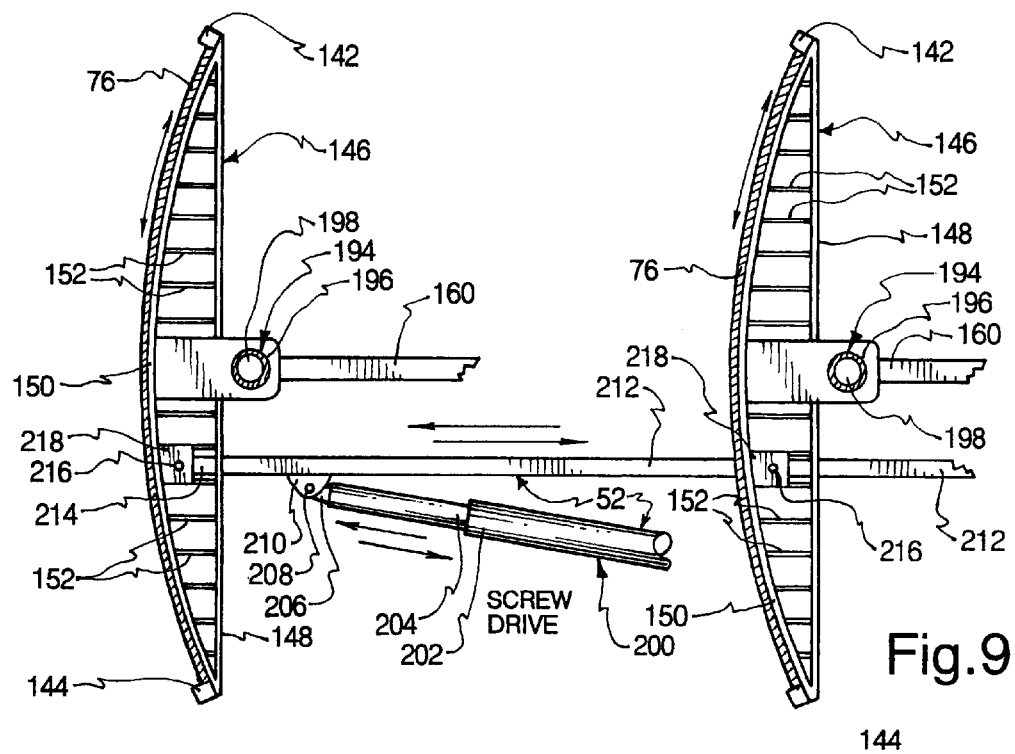
FIG. 9 is an elevational view, shown partly in cross section, illustrated in the manner in which the tilt of the array of reflectors is altered to maintain perpendicularity with the sun.

The previously mentioned toggle mechanism 52 may comprise a motor-driven screw drive, generally designated 200, which comprises an internally helically threaded cylinder 202 and a rod 204, the internal end of which is threadedly engaged with the interior threads of the cylinder 202, to accommodate extension and refraction. The distal end 206 of the rod 204 is pivotally connected, at 208, to a bracket comprising a pair of lugs 210. Lugs 210 are integrally connected, by welding, fasteners or the like to a pair of toggle displacement bars 212 (only one of which is seen in FIG. 9), which are reciprocated to an fro by the motor-driven extension and retraction of rod 204. The distal ends 214 of the two toggle bars 212 are respectively connected pivotally at 216 to, adjacent anchor plates 218 welded or otherwise secured to juxtaposed parallel trusses 146. The connection site 216 is eccentrically located to facility rotation of the reflector frames 140 around the axles.

Thus, as detector 48 at shadow bar 173 photoelectrically determines the need to adjust the tilt of the array of reflectors, a signal is sent to the screw drive motor 230 (FIG. 12), which in turn causes extension or retraction of the rod 104, which in turn displaces the toggle bars 212 fore or aft to pivot the array of reflectors in unison around the axles upon which the reflector frames 140 are rotatably mounted. See FIG. 9. The toggle bars 212 consecutively pivotably and eccentrically connect at 216 to one of each line of reflector frames 140, as best illustrated in FIG. 9, so that all reflector frames 140 and all reflectors 76 rotate together around parallel horizontal axes.

Keep in mind that the detector 48 (FIG. 6) is mounted to one of the trusses 146 (FIG. 6) so that the shadow bars 173 and 175 are in a plane essentially parallel to the plane containing bar 148 of the truss 146 which supports the detector 48.

Figure 10:
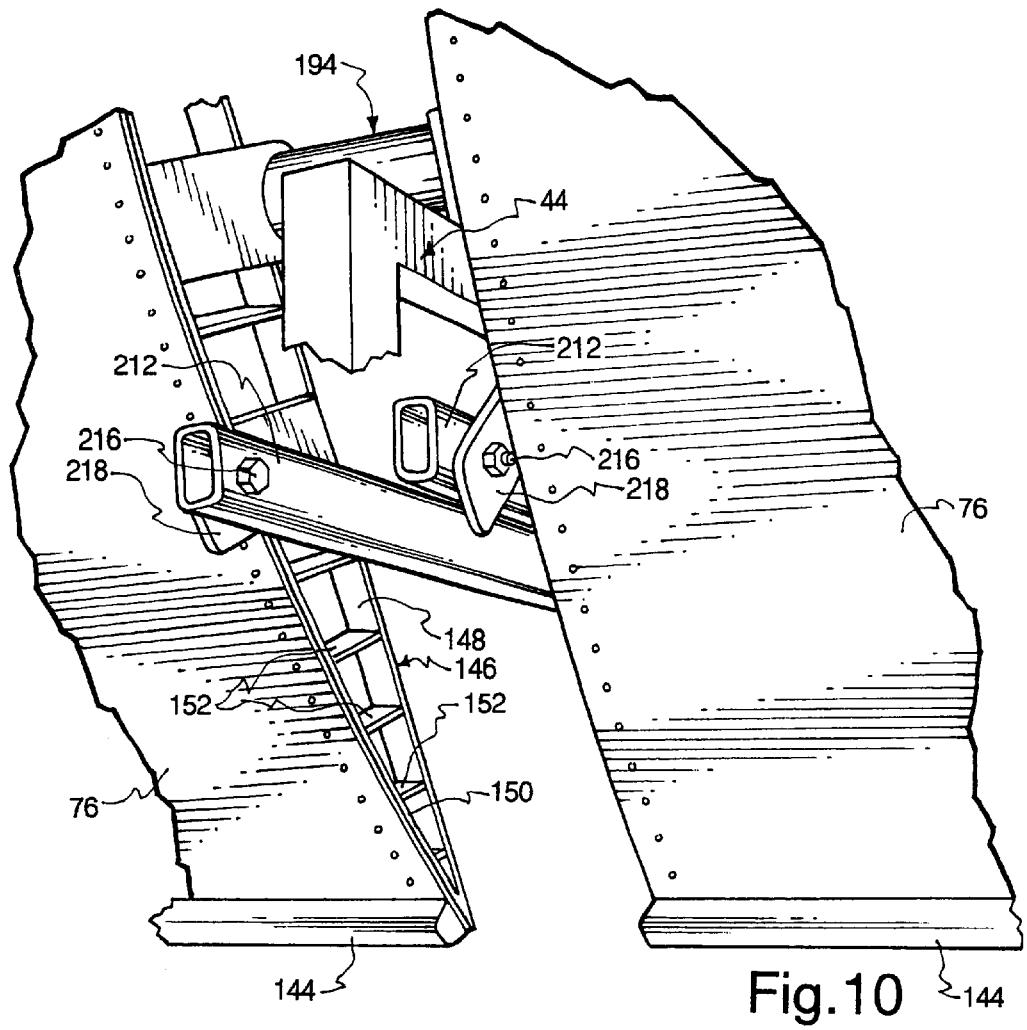
FIG. 10 is a fragmentary perspective illustrating, in part, the toggle mechanism by which the tilt of the array of reflectors is changed to maintain perpendicularity with the rays of the sun.
Figure 16:
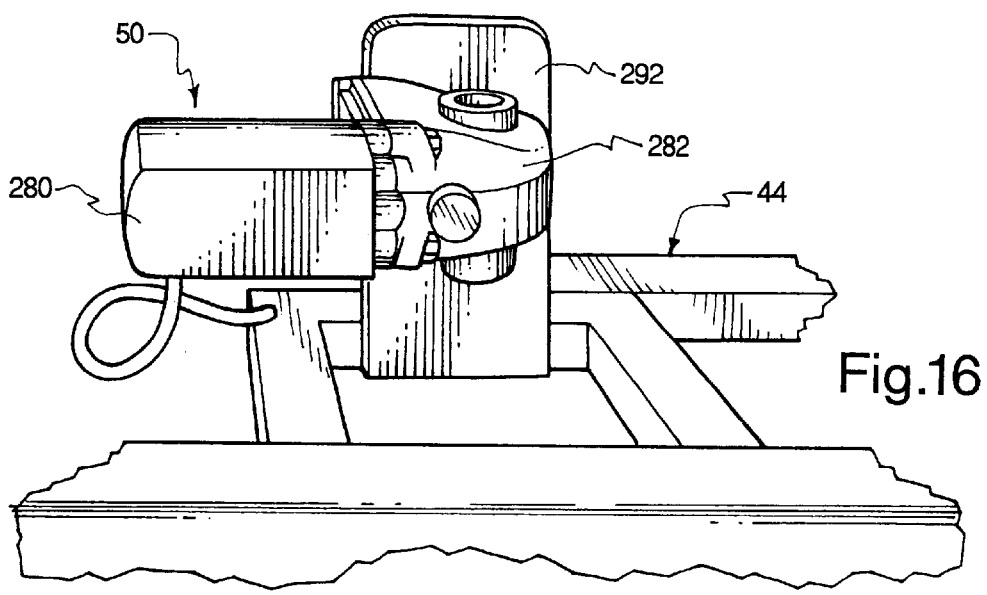
FIG. 16 is a fragmentary enlarged perspective representation illustrating a portion of the upper, displaceable frame, the motor and differential by which the upper frame is rotated selectively upon the lower frame.
Figure 11:
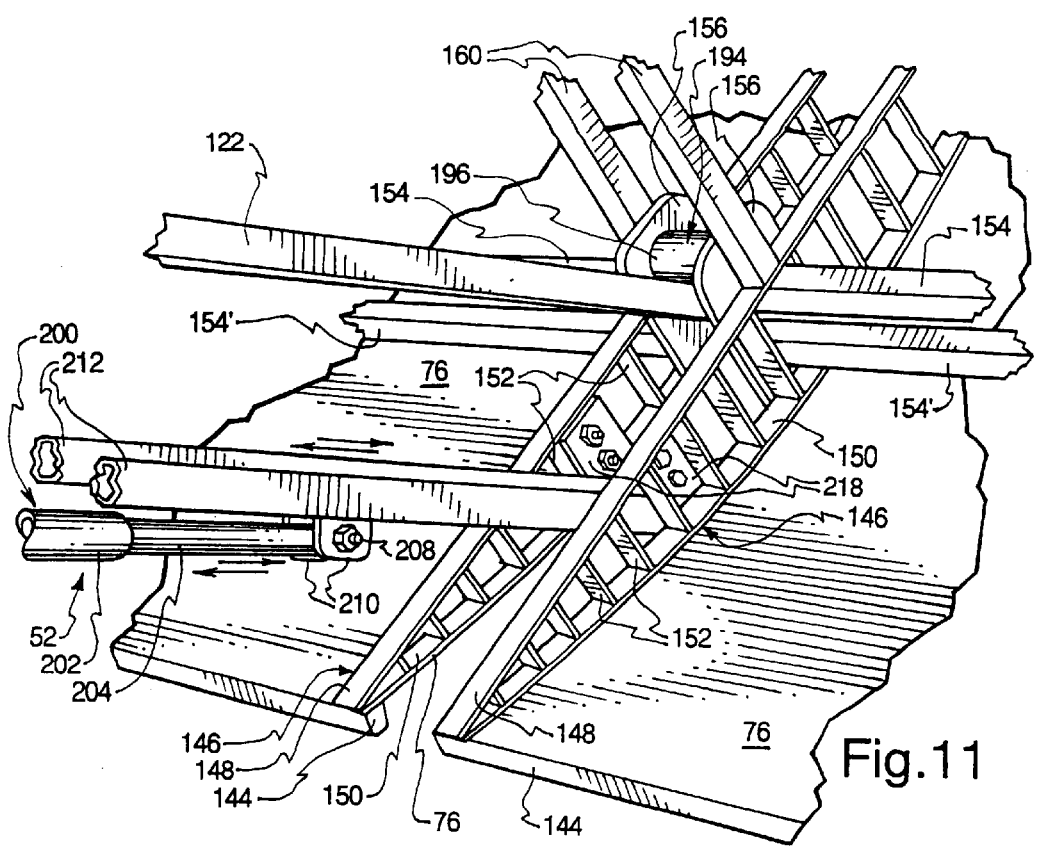
FIG. 11 is an enlarged fragmentary representation of the toggle mechanism illustrated in FIG. 10 viewing the same from the concave side of the reflectors as opposed to the convex side.
Figure 12:
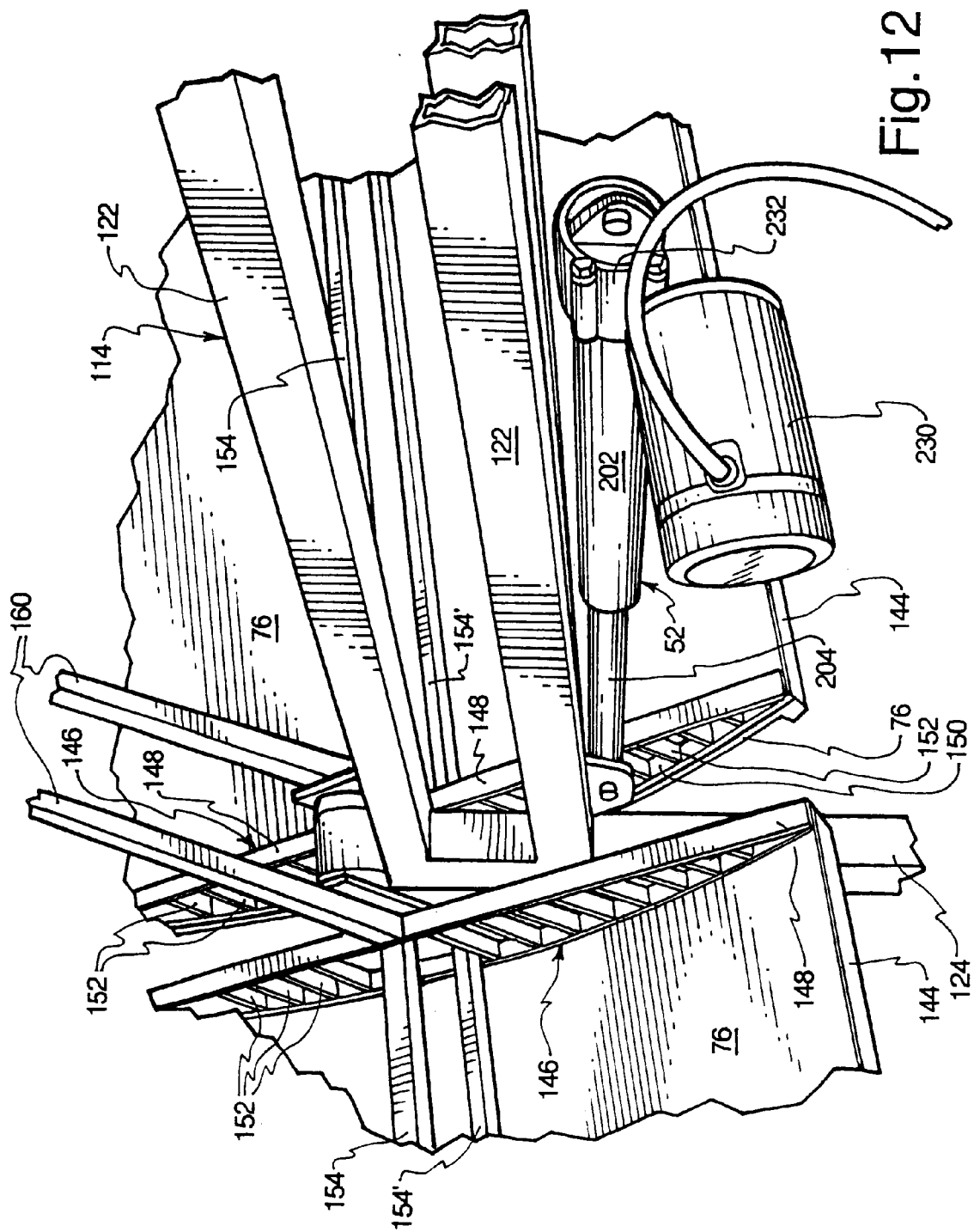
FIG. 12 is an enlarged fragmentary perspective similar to FIG. 11 further illustrating the manner in which a screw drive is motor displaced responsive to optical signals to change the tilt of the array of reflectors to maintain the above-mentioned perpendicularity.

Specific reference is now made to FIG. 10 through 12, which illustrate one way in which the toggle mechanism 52 may be connected to adjacent reflector frames 146. The two toggle bars 212 are illustrated as being parallel and hollow structural members having a rectangular cross section (FIG. 10). The toggle connection plates 218 are illustrated in FIG. 10 as extending beyond the two adjacent reflectors 76, as does the distal ends of each toggle bar 212. The pivotal connectors 216 are illustrated as being nut and bolt assemblies pivotally passing through, in each case, the associated toggle bar 212 and the connection plate 218, to accommodate the previously mentioned changes in the tilt angle of the array of reflectors 76 and reflector frame 140.

FIG. 11 is similar to FIG. 10, but illustrates the motorized tilt adjusting mechanism 52 for the array of reflectors 76 from a perspective essential opposite to perspective of FIG. 10.

The screw drive 200 is again illustrated in FIG. 12, which further depicts motor 230, conventionally connected to transmission or differential 232, so that when the reversible motor 230 is actuated by a signal from the optical detector 48 (FIG. 6) to unitarily alter the angular relationship of the array of reflectors in respect to the vertical, the screw drive 200 is extended or retracted, depending upon the displacement necessary to restore the angle of tilt of the reflectors to perpendicularity with the rays of the sun.

As mentioned earlier in conjunction with FIG. 1, the upper frame 44 is rotatably mounted upon the curved track 56, which track, as illustrated, is in the form of a circular I-beam. More specifically, the upper rotatable frame 44 is made selectively rotatable in respect to the stationary track 56 using a plurality of load-transferring trucks 250, one of which is illustrated in FIG. 13. Each truck 250, as illustrated, comprises a U-shaped frame, generally designated 252, preferably formed of steel comprising two pairs of lugs or ears 254 and a U-shaped bridge 256. The lugs 254 and the bridge 256 are held in spaced relation in respect to the I-beam track 56, as best illustrated in FIGS. 14 and 15. An upper frame displacement roller 258 is rotatably supported by each lug 254 upon a shaft 260. Each shaft 260 is non-rotatably carried by the associated lug 254 in the manner illustrated in FIG. 14. As best seen in FIGS. 13 and 14, each of the four rollers or casters 258 frictionally engage and rotatably travel along the upper surface of lower flange 60 of the I-beam track 56.

Each truck 252 is rigidly connected to the upper, rotatable frame 44. This may be as illustrated in FIG. 13, i.e., by use of two angle irons welded in spaced relation to the upper horizontal surface of the associated bridge 256. See FIGS. 13 and 15, specifically. The spacing between the vertically directed legs of the angles 262, shown at 264 (FIG. 15) accommodates snug reception of one horizontal member 45 of the upper frame 44. Nut and bolt assemblies 266 (FIG. 13) are illustrated as being utilized to fasten each angle piece 262 to the upper frame member 45.

Thus, a plurality of idler trucks 250 are used to provide load transfer to the lower flange 60 of the I-beam track 56 and to accommodate rotation of the upper frame 44 in respect to the lower frame responsive to location correcting signals issued from the optical detector 48.

To prevent the upper frame from jumping the track 56, each truck 250 is equipped with vertically directed, web-engaging opposed rollers 268. See FIG. 15. These rollers maintain appropriate alignment between the upper frame and the trucks 250 in respect to the lower frame and circular track 56. The rollers 268 contiguously engage the opposite surfaces of the web 52 of the I-beam 56, each being rotatably mounted upon L-shaped axle 270, which accommodates rotational travel by the rollers 268 along the web 62 as the rollers 258 correspondingly travel along the upper surface of the lower flange 60 of the I-beam 56.

Reference is now made to FIGS. 2 and 16 through 19, which collectively illustrate the motor and rotational drive mechanism 50. The mechanism 50 comprises a reversible motor 280, which is activated and deactivated by signals derived from the optical sensor 48 by which the array of reflectors are maintained, from an azimuth point of view, in a perpendicular orientation with respect to the rays of the sun.

Reversible motor 280 rotates a differential or gear transfer box 282, which in turn rotates an external drive shaft 284 (FIG. 18), which turns a drive sprocket 286, non-rotatably secured to the shaft 284. The sprocket 286 turns to engage successive links 288 of the previously mentioned drive chain (FIG. 2) 90. The chain drive 90 is statically secured, as by welding, at its distal and proximal ends to the static I-beam track 56, providing enough length to accommodate engagement with the sprocket 286. Rotational displacement of the sprocket 286 causes the sprocket to walk, in one direction or the other, along the links 288 of the chain 90 to rotate the upper frame 44 upon the lower frame 42 to maintain reflector perpendicularity with the sun from sunrise to sunset during the longest day of the year in any location upon the face of the earth. The chain 90, between welded ends, rests upon the top surface of the lower flange 60, as shown in FIGS. 2, and 17–19. Thus, the chain drive 90 is loose at all locations, except where it is welded to the track 56 at its opposed ends. The length of the chain drive 90 is selected so as to snugly pass around the sprocket 286 in taut relation.

Thus, rotation by motor 280 of the shaft 284 and the sprocket 286, either clockwise or counterclockwise, will result in the upper frame 44 turning in respect to the lower frame, in one direction or the other, to maintain azimuth perpendicularity with the sun, in the manner described earlier. Note that the motor 280 and the differential 282 are statically mounted upon a mounting plate 292 of the upper frame 44. Mounting plate 292 is preferably formed of steel and is bolted, welded or both to the upper frame 44. Signals from the optical detector 48 turn the reversible motor 280 on and off in one direction or the other consistent with optical detection of non-azimuth perpendicularity between the array of reflectors and the location of the sun in the sky.

Figure 17:
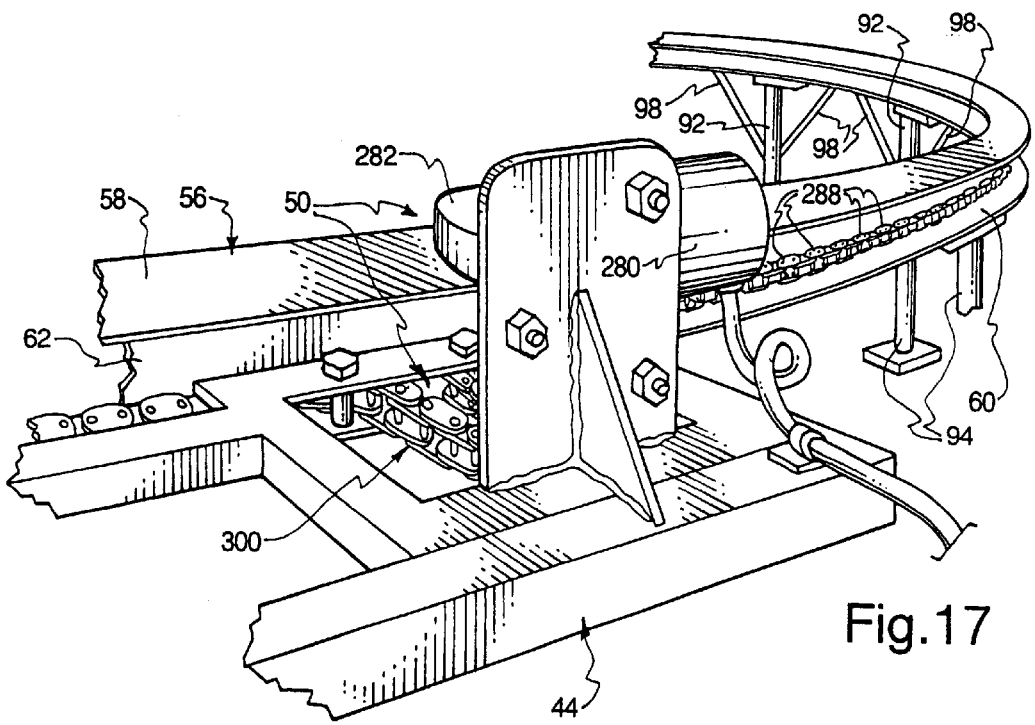
FIG. 17 is a fragmentary enlarged perspective illustrating the motor and rotational drive system by which the upper frame is rotated selectively upon the lower frame.
Figure 18:
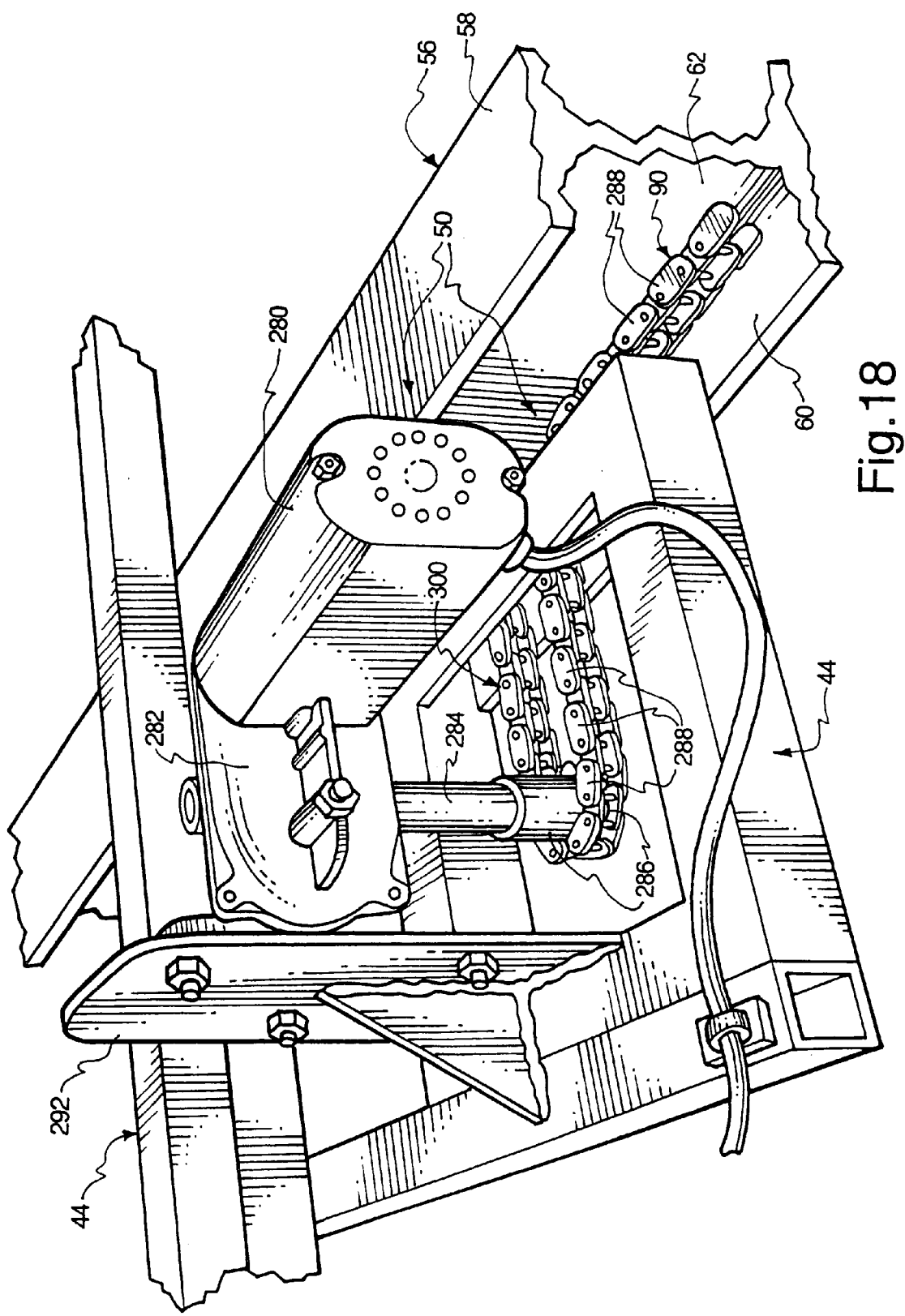
FIG. 18 is likewise an enlarged fragmentary perspective of the rotational drive system by which the upper frame is rotated selectively in respect to the lower frame for preserving perpendicularity with the sun.

As seen best in FIGS. 17 and 18, the chain 90 comprises a U-shaped segment, generally designated 300, which passes tautly around the sprocket 286. The sprocket contains teeth, sized and shaped to engage hollow spaces within each link 288 of the chain 90. Accordingly, as the sprocket 286 is rotated by motor 280, the differential 282 and the shaft 284, successive links 288 of the chain drive 90 are engaged by the sprocket teeth causing the upper frame 44 to rotate along the track 56 in the manner explained above to preserve the mentioned perpendicularity. The motor 280 is reversible and, therefore, shaft 284 may be turned in either direction to move the upper frame 44 clockwise or counterclockwise along the lower stationary track 56.

The present invention is not confined to any specific form for the lower stationary frame and/or the upper displaceable frame. Similarly, the present invention may be implemented by placing it above the roof of an existing building supported by columns, on an existing flat or sloped roof of an existing building, on or immediately above an existing surface, such as a parking lot, for example, on columns above an existing surface (to allow traffic underneath) or in any other suitable location.

Reference is made to FIG. 20, which illustrates one way of mounting an embodiment of the present invention comprising a lower static frame 42' comprising a curved track 56', which is also static, supported upon a plurality of columns 310 (only one of which is illustrated), wherein the proximal end 312 of each column extend into the ground and is encased in concrete 314, for stability.

Each column 310 is secured as by welding at sites 314 to the lower static truss 42'. Frame 42' is illustrated as comprising a plurality of members 316, arranged conventionally to form triangular supports. The structural members 316 may be of any appropriate cross sectional shape, preferably formed of steel.

The track 56' is illustrated as being circularly disposed with the flanges 58' and 60' being vertically not horizontally directed and the web 62' being horizontally directed. The lower edges of the flanges 58' and 60' contiguously engage and are secured to the lower frame 42', as by welding. The load comprising the reflectors, the reflector frames, the upper rotatable frame 44' wind and/or snow comprise a substantial load transferred through a plurality of trucks 252' and rollers 258' to the web 62' of the track 56'.

Reference is now made to FIG. 21 which illustrates one way in which large installations in accordance with the present invention may be implemented. More specifically, two or more static tracks 56, of the type previously described, are concentrically provided so that a large array of reflectors and reflector frames carried upon a displaceable upper frame may rotate in unison along the plurality of tracks 56 as earlier described. Thus, the size of any installation utilizing the present invention is flexible, ranging from a very small installation comprising a few reflectors to an extremely large installation comprising a large number of reflectors.

Where a sequence of reflectors and reflector frames aligned longitudinally one with another is utilized, in lieu of the motor and toggle tilting mechanism 52, described above, a torque tube, generally designated 330 in FIG. 22 may be used. The torque tube 330 may be of hollow tubular steel construction to which is attached a plurality of tracking arms 332, joined, respectively, in an eccentric disposition to each reflector frame 140 of a line of such frames. Rotation of the torque tube 330 will in turn alter the tilt angle of the associated reflectors 76 and reflector frames 140. This rotation is achieved by one or more drive arms 334 integrally connected as by welding to the tube 330. The distal end 336 is pivotally connected to the distal end of the previously described rod 204 of the screw drive 200 so that extension and retraction of the rod 204 rotates the torque tube 330 through the drive arm 334 clockwise and counterclockwise, respectively, for the purpose of adjusting the tilt of the related reflectors to preserve perpendicularity with the rays of the sun, as mentioned earlier. A plurality of torque tubes may be used as would be appropriate. More than one screw drive 200 may be used in conjunction with any given torque tube without departing from the spirit of the present invention.

As mentioned previously, when the energy converter 54 transforms solar energy into thermal energy, a hollow tube 340 (FIG. 24) may be located at the focal line of the associated reflector. Tube 340 may be of any thermally conductive material, such as copper. A liquid is displaced through the hollow interior 342 as the line-focused sunlight 344 impinges upon and heats the tube 340, causing the liquid contained in the tube 340 to be heated from one temperature to a significantly higher temperature.

In the configuration of FIG. 24, a U-shaped housing 345 of suitable material, such as sheet metal or, plastic surrounds part of the tube 340 within the housing 345. The housing 345 comprises opposed lower lips 346, which accommodate sheet reception and retention of transparent lens 348, which may be glass or synthetic resinous material. The tube 340 is illustrated as being imbedded, in part, in a block of insulation 350, so that the heated liquid within the hollow interior 342 of the tube 340 does not undesirably or prematurely cool. The block of insulation 350 is illustrated in FIG. 24 as surrounding approximately 260 degrees of the tube 340 when viewed in cross section, i.e., the top and most of the two sides, leaving the bottom of the tube 340 open for impingement of the reflected line-focused rays 344 of the sun through the lens 348 directly upon the exterior of the tube 340.

In lieu of the configuration illustrated in FIG. 24, the embodiment of FIG. 25 may be utilized wherein the block of insulation 350' extends only along 180 degrees of the exterior tube 340 when viewed in cross section.

As mentioned earlier, some or all of the focus lines of the parabolic trough-shaped reflectors 76 may be equipped with solar-to-electricity converters. More specifically, in reference to FIG. 26, converter 54 may comprise a housing 360 having a tapered hollow interior. The top of 362 may be equipped with a plurality of aligned Fresnel lenses 364. Each Fresnel lens 264 comprises concentric grooves upon which is impinged the reflected line-focused sunshine 366. The grooves of each Fresnel lens converts the reflected line-focused sunshine 366 to reflected point-focused sunlight 368. Each segment of point-focused sunlight is impinged upon one of the solar cells 190. Several commercially available solar cells exist any of which may be used as solar cells 190. While the input to each solar cell 190 is solar energy, the output is electrical energy, communicated from the solar-to-electricity converter 54 upon electrical leads 370. This electrical energy is direct current electricity. If alternating current electricity is desired, DC/AC converter 192 may be utilized from which conventional household electricity may be derived.

Continued reference is made to FIG. 26, which illustrates a circular funnel-shaped secondary solar energy reflector 372 disposed above each solar cell 190, by which any stray solar energy is reflected so that all sunlight passing through the associated Fresnel lens 264 is caused to impinge upon the associated solar cell 190.

As mentioned earlier, it is ordinarily appropriate to cool the solar cells 190. This may be done by placing each solar cell contiguously on the exterior of a cooling tube 374, through which liquid coolant is displaced to not only cool the solar cells 190 but to convert the heat so transferred to useable thermal energy.

Figure 27:
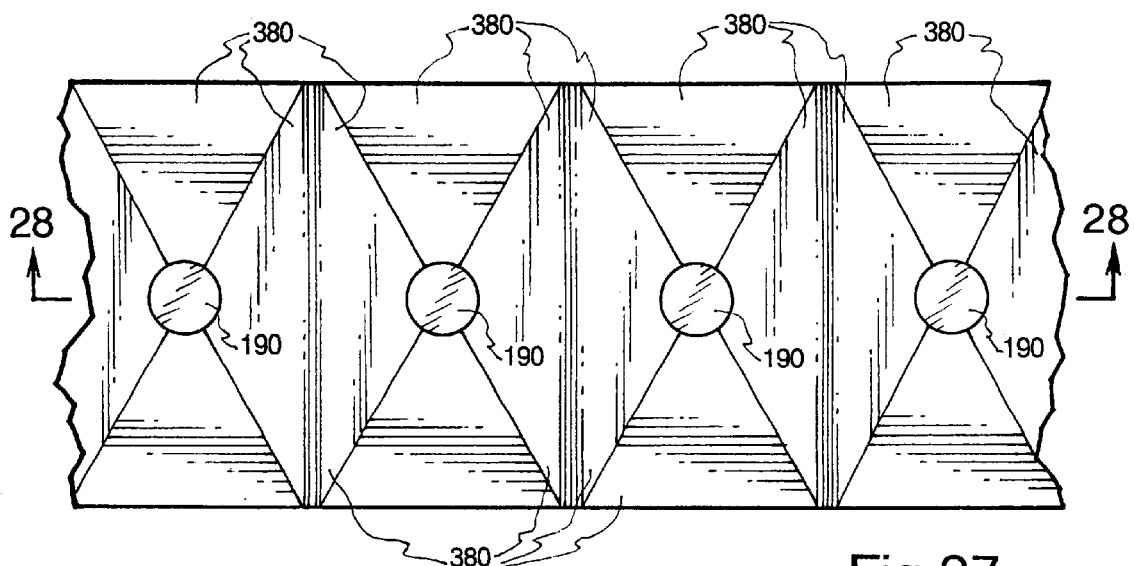
FIG. 27 is a plan view illustrating a different form of secondary reflector to ensure point focus impingement of reflected sunlight upon solar cells.
Figure 28:
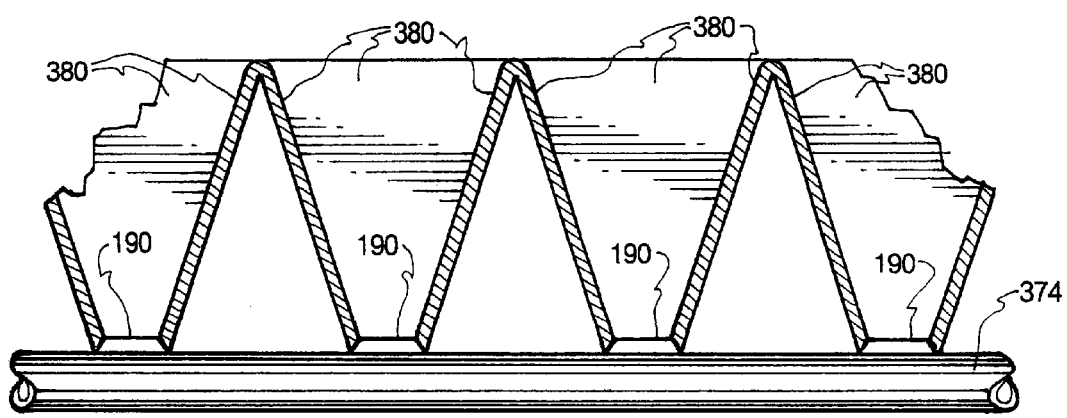
FIG. 28 is a cross sectional view taken along line 28—28 of FIG. 27.

In lieu of the circular funnel-shaped secondary reflectors 372, the reflectors 380 of FIGS. 27 and 28 may be used. Each reflector 380 is rectangular in cross section with four downwardly tapered flat walls intersecting at diagonally-disposed corners, with a solar cell at the bottom of each reflector 380. In either case, the internal surface of secondary reflectors 372 and/or 380 is selected to accommodate full reflection of any stray sunlight so that all sunlight passing through any Fresnel lens 364 is caused to impinge upon the associated solar cell 190.

Reference is now made to FIGS. 29 and 30, which illustrate another reflector embodiment of the present invention with the support frame on the convex or back side of the reflector, as opposed to being on the front or concave side. More specifically, all or any one of the parabolic trough-shaped reflectors 76 maybe supported on the back or reverse side thereof to provide a slightly more unencumbered reflective surface. As shown in FIG. 29, reflector 76 is supported by a reflector frame 400. Reflector frame 400 comprises the previously described upper and lower longitudinal reinforcement of members 142 and 144. Midway between the members 142 and 144, on the back side of the reflector 76, are two contiguous longitudinally extending rectangular supports 154" comprising, at each end, blunt edges 155 essentially aligned with the adjacent end edge of the associated reflector 76.

A plurality of parabolically shaped ribs, each generally designated 402, span, at spaced intervals, between respectively member 142 and one of the two central members 154" and between member 144 and the other of the two central support members 154', as illustrated in FIG. 29.

Each rib 402, as best illustrated in FIG. 30, comprises a U-shaped brace having opposed outwardly directed flanges 404, which are contiguous with and adhered by a simple bonding agent or the like to the back surface of reflector 76 at interface sites 406. The each rib 402 further comprises opposed parallel side walls 408, which respectively merge with the associated one of the two flanges 404 essentially through a 90 degree angle. The spaced side walls 408 merge respectively at 90 degree corners with a back wall 410, which is cut at opposite ends into integral end tabs 412 and 414. Each end tab 412 is contiguous with and bonded to member 142 or member 144, depending upon whether the rib is a top rib or a bottom rib. See FIGS. 31 and 32.

In addition to the foregoing, the reflector frame 402 will be rotatably connected to the previously described axle structure and eccentrically to the previously described toggle mechanism to accommodate rotation around a horizontal axis to accommodate periodic changes in the tilt of the reflector 76 to preserve perpendicularity with the rays of the sun, for the purposes set forth above.

The invention may be embodied in other specific forms without departing from the spirit of the central characteristics thereof. The present embodiments therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by Letters Patent is:

1. A method of transforming solar energy to electrical energy comprising the acts of:
   (a) impinging rays of sunshine upon an array of line-focusing parabolic trough reflectors;
   (b) mechanically and collectively tilting the reflectors in respect to at least one essentially horizontal axis and mechanically and collectively turning the reflectors along a curved track in respect to an essentially vertical axis so that the reflectors individually and collectively are essentially perpendicular to the rays of sunshine;
   (c) position-correcting the tilt and track orientations of the reflectors collectively to retain said essentially perpendicular relationship;
   (d) transforming reflected sunlight to electrical energy along a focal line of each reflector; and
   (e) communicating the electrical energy for use.

2. A method according to claim 1 wherein the transforming act comprises changing the line focus of reflected sunlight to a series of focal points sites and imposing the point focused reflected sunlight upon a series of solar cells at said sites.

3. A method according to claim 2 wherein the changing act comprises passing the line focused reflected sunlight through a series of Fresnel lenses.

4. A method of transforming solar energy to electrical energy comprising the acts of:
   (a) impinging rays of sunshine upon an array of line-focusing parabolic trough reflectors;
   (b) mechanically and collectively tilting the reflectors in respect to at least one essentially horizontal axis and mechanically and collectively turning the reflectors along a curved track in respect to an essentially vertical axis so that the reflectors individually and collectively are essentially perpendicular to the rays of sunshine;
   (c) position-correcting the tilt and track orientations of the reflectors collectively to retain said essentially perpendicular relationship;
   (d) transforming reflected sunlight to electrical energy along a focal line of each reflector;
   (e) communicating the electrical energy for use;
   the transforming act comprising changing the line focus of reflected sunlight to a series of focal points sites and imposing the point focused reflected sunlight through a series of fresnel lenses upon a series of solar cells at said sites;
   the imposing act being preceded by further reflecting stray sunlight passing through the Fresnel lenses from at least one converging surface onto each solar cell.

5. A method according to claim 1 wherein the transforming act comprises point focusing reflected sunlight at the focal line of each reflector upon a solar cell and outputting said electrical energy from each solar cell.

6. A method according to claim 5 wherein the point focusing is achieved by passing the line focused sunlight through a lineal series of Fresnel lens.

7. A method according to claim 5 wherein the point focusing is achieved by passing the line focused sunlight through a series of Fresnel lenses and concentrating the sunlight output from each Fresnel lens upon an associated solar cell with a funnel-shaped reflector peripherally disposed around the solar cell.

8. A method of converting solar energy to electrical energy comprising the acts of:
   progressively and collectively turning and tilting an array of parabolic trough reflectors to maintain an essentially perpendicular relationship between rays of sunlight and the reflectors while converting reflected sunlight concentrated along focal lines of the reflectors to electrical energy, the converting step comprising transforming reflected line focused sunlight to point focused reflected sunlight at spaced locations along the focal lines and imposing the point focused reflected sunlight upon solar cells at said spaced locations to produce electricity.

9. A method of convening solar energy to thermal and electrical energy comprising the acts of:

progressively and collectively turning and tilting an array of parabolic trough reflectors to maintain an essentially perpendicular relationship between rays of sunlight and the reflectors while convening reflected sunlight concentrated along focal lines of the reflectors to thermal energy and electrical energy, the converting step comprising beating tube-containing water along some of the focal lines and energizing solar cells adjacent other focal lines to produce electricity.

10. A method of converting solar energy to electrical energy comprising the acts of:

progressively and collectively turning and tilting an array of parabolic trough reflectors to maintain an essentially perpendicular relationship between rays of sunlight and the reflectors while converting reflected sunlight concentrated along focal lines of the reflectors to electrical energy, the converting step comprising point focusing reflected line focused sunlight at a plurality of locations upon linearly spaced solar cells to produce electricity.

11. A method of converting solar energy to thermal energy and electrical energy comprising the acts of:

progressively and collectively turning and tilting an array of parabolic trough reflectors to maintain an essentially perpendicular relationship between rays of sunlight and the reflectors while converting reflected sunlight concentrated along focal lines of the reflectors to thermal energy and electrical energy, the converting step comprising heating tube-contained water with line focused reflected sunlight along some of the focal lines and point focusing reflected line focused sunlight at other focal lines upon solar cells to produce electricity.

12. A method of converting solar energy to electrical energy comprising the acts of:

positioning an assembly of reflectors so that each reflector is essentially perpendicular to rays of sunlight;

reflecting the sunlight from each reflector so as to focus the sunlight in concentrated form along a focal line; and converting the line focused reflected sunlight to electrical energy, the converting act comprising refracting reflected line focused sunlight into point focused sunlight at least one of the focal lines and imposing the point focused sunlight upon a plurality of solar cells near other focal lines to produce electricity.

13. A method of converting solar energy to thermas energy and electrical energy comprising the acts of:

positioning an assembly of reflectors so that each reflector is and remains essentially perpendicular to rays of sunlight;

reflecting the sunlight from each reflector so as to focus the sunlight in concentrated form along a focal line; and converting the line focused reflected sunlight to thermal energy and electrical energy, the converting act comprising transforming line focused reflected sunlight into point focused reflected sunlight by imposing the line focused reflected sunlight upon light concentrators selected from the group consisting of fresnel lenses and convergently tapered secondary reflectors to produce point focused sunlight, and impinging the point focused sunlight upon one or more solar cells for production of electricity.

14. An apparatus for transforming solar energy to thermal energy comprising:

(a) an array of linear line-focusing angularly adjustable parabolic trough reflectors arranged in series and parallel;

(b) an upper frame supporting the array of angularly adjustable parabolic trough reflectors;

(c) a lower frame rotatably supporting the upper frame upon a track;

(d) a control system for automatically collectively adjusting the angularity of each parabolic trough reflector and for curvilinearly displacing the upper frame along the track upon the lower frame, to obtain and retain essentially perpendicularity between rays of sunshine and the reflectors whereby reach reflector reflects and focuses sunlight along a line; and (e) an energy converter located at at least one of the focus lines by which reflected line focused sunlight is transformed into thermal energy, the energy converter comprising a tube containing water located at at least one of the focus lines, which water is heated by the line focused reflected sunlight.

15. An apparatus according to claim 14 further comprising external insulation carried externally on the tube exclusive of where reflected line focused sunlight impinges on the tube.

16. An apparatus according to claim 14 further comprising an elongated housing at the focus line in which the tube is disposed.

17. An apparatus according to claim 16 wherein the housing comprises a window through which line focused reflected sunlight passes prior to being impinged upon the tube.

18. An apparatus for transforming solar energy to electrical energy comprising:

(a) an array of line-focusing angularly adjustable parabolic trough reflectors upon which sunlight is impinged and reflected;

(b) an upper frame supporting the array of angularly adjustable parabolic trough reflectors;

(c) a lower frame rotatably supporting the upper frame upon a track;

(d) a control system for collectively adjusting the angularity of each parabolic trough reflector and for rotating the upper frame along the track of the lower frame, to obtain and retain essentially perpendicularity between rays of sunshine and the reflectors whereby reach reflector reflects and focuses sunlight along a line; and (e) an energy converter located at at least one of the focus lines by which reflected line focused sunlight is transformed into electrical energy.

19. An apparatus according to claim 18 wherein the energy converter comprises a point focusing structure located at at least one of the focus lines by which the line focused reflected sunlight is changed to point focused reflected sunlight and a solar cell at the point of focus by which point focused reflected sunlight is changed to electrical energy.

20. An apparatus according to claim 19 wherein the point focusing structure comprises a series of Fresnel lenses linearly arranged along the focal line.

21. An apparatus according to claim 19 wherein the focusing structure comprises light concentrators each having at least one converging side wall surface and a throat, with the solar cell disposed at the throat.

22. An apparatus according to claim 18 wherein the track comprises a curvilinear I-beam comprising an upper flange, a lower flange and a web and the upper frame comprises I-beam followers.

23. An apparatus according to claim 22 wherein the I-beam followers each comprise first rollers rotatably in contact with the lower flange of the I-beam to accommodate rotation of the upper frame in respect to the lower frame and second rollers in contact with the web of the I-beam to prevent the upper frame from jumping the track.

24. An apparatus according to claim 23 wherein the first and second rollers are rotatably carried by at least one carriage of the upper frame.

25. An apparatus according to claim 24 wherein the carriage comprises a trunnion.

26. An apparatus according to claim 21 wherein the reflectors are gang connected together in series and in parallel.

27. An apparatus according to claim 18 wherein the control system comprises at least one displaceable toggle mechanism connected to the reflectors and selectively motor actuated for displacing the toggle mechanism to achieve said angularity thereby to achieve and maintain said perpendicularity.

28. An apparatus according to claim 18 wherein the control system comprises a motor-driven displacement mechanism by which the upper frame is turned relative to the lower frame upon the track to achieve and maintain said perpendicularity.

29. An apparatus according to claim 18 wherein the control system comprises at least one rotatable torque tube connected to the reflectors and selectively motor rotated for achieving said angularity to thereby achieve and maintain said perpendicularity.

30. An apparatus for converting solar energy to electrical energy comprising:

an array of parabolic trough reflectors;

a control system for maintaining an essentially perpendicular relationship between rays of sunlight and the reflectors; and an energy converter for converting reflected sunlight concentrated along focal lines of the reflectors to electrical energy, the energy converter comprising sunlight concentrators for transforming reflected line focused sunlight to point focused reflected sunlight at spaced locations along at least some of the focal lines and solar cells adjacent to said spaced locations upon which point focused reflected sunlight is impinged to produce electricity.

31. An apparatus for converting solar energy to thermal energy and electrical energy comprising:

an array of parabolic trough reflectors;

a control system for automatically maintaining an essentially perpendicular relationship between rays of sunlight and the reflectors; and an energy converter for converting reflected sunlight concentrated along focal lines of the reflectors to thermal energy and electrical energy, the energy converter comprising: (a) tube contained water at least some of the focal lines whereby line focused reflected sunlight heats the water and (b) sunlight concentrators at focal lines transforming reflected line focused sunlight into point focused reflected sunlight and a solar cell adjacent to each sunlight concentrator upon which point focused reflected sunlight is impinged to produce electricity.

32. An apparatus for converting solar energy to at least one other form of energy comprising:

an assembly of reflectors;

a reflector control system so that each reflector is automatically retained essentially perpendicular to rays of sunlight and therefore sunlight reflected from each reflector is concentrated along a focal line; and an energy converter for receiving and converting the line focused reflected sunlight to electrical energy, the energy converter comprising refracting lenses by which reflected line focused sunlight is changed into point focused sunlight at least one of the focal lines and a plurality of solar cells upon which the point focused sunlight is impinged to produce electricity.

* * * * *